United States Patent
Kulkarni et al.

(10) Patent No.: US 9,153,374 B2
(45) Date of Patent: *Oct. 6, 2015

(54) COOLING ARRANGEMENTS FOR DRIVE SYSTEMS

(71) Applicants: Devdatta Kulkarni, Austin, TX (US); Thomas Keister, Georgetown, TX (US)

(72) Inventors: Devdatta Kulkarni, Austin, TX (US); Thomas Keister, Georgetown, TX (US)

(73) Assignee: TECO-Westinghouse Motor Company, Round Rock, TX (US)

( * ) Notice: Subject to any disclaimer, the term of this patent is extended or adjusted under 35 U.S.C. 154(b) by 249 days.

This patent is subject to a terminal disclaimer.

(21) Appl. No.: 13/930,224

(22) Filed: Jun. 28, 2013

(65) Prior Publication Data
US 2015/0003015 A1    Jan. 1, 2015

(51) Int. Cl.
   *H05K 7/20*         (2006.01)
   *H01F 27/18*       (2006.01)
   *H02M 7/00*       (2006.01)

(52) U.S. Cl.
   CPC ............. *H01F 27/18* (2013.01); *H02M 7/003* (2013.01); *H05K 7/202* (2013.01); *H05K 7/20309* (2013.01); *H05K 7/20936* (2013.01); *H05K 7/20327* (2013.01)

(58) Field of Classification Search
   CPC ............. H01F 27/18; H05K 7/20254; H05K 7/20936; H02M 7/003
See application file for complete search history.

(56) References Cited

U.S. PATENT DOCUMENTS

| | | | |
|---|---|---|---|
| 3,581,212 A | 5/1971 | McMurray |
| 3,641,419 A | 2/1972 | Koltuniak et al. |
| 3,749,981 A | 7/1973 | Koltuniak et al. |
| 3,867,643 A | 2/1975 | Baler |
| 4,052,657 A | 10/1977 | Kleiner |
| 4,342,002 A | 7/1982 | Gabr |
| 4,674,024 A | 6/1987 | Paice et al. |
| 5,239,128 A | 8/1993 | Golden et al. |
| 5,289,363 A | 2/1994 | Ferchau et al. |
| 5,619,407 A | 4/1997 | Hammond |
| 5,625,545 A | 4/1997 | Hammond |
| 5,638,263 A | 6/1997 | Opal |
| 5,734,565 A | 3/1998 | Mueller et al. |
| 5,986,909 A | 11/1999 | Hammond |

(Continued)

OTHER PUBLICATIONS

Jeremy C. Howes, et al., "Cooling of an IGBT Drive System with Vaporizable Dielectric Fluid (VDF)," Parker Hannifin Corporation, 2008, 4 pages.

(Continued)

*Primary Examiner* — Robert J Hoffberg
(74) *Attorney, Agent, or Firm* — Trop, Pruner & Hu, P.C.

(57) ABSTRACT

In an embodiment, a drive system includes a transformer enclosed in an enclosure including a heat exchanger to cool a fluid medium. In addition, the system includes a plurality of power cubes each including a rectifier, a DC-link, and an inverter. Each power cube may include a plurality of cold plates each coupled to a corresponding switching device of the inverter, an inlet port in communication with a first one of the plurality of cold plates and an outlet port in communication with a last one of the plurality of cold plates. In turn, a manifold assembly is to couple at least the power cubes to enable two phase cooling of the power cubes and the transformer via one or more heat exchangers.

17 Claims, 22 Drawing Sheets

(56) References Cited

U.S. PATENT DOCUMENTS

| | | |
|---|---|---|
| 6,005,788 A | 12/1999 | Lipo et al. |
| 6,014,323 A | 1/2000 | Aiello |
| 6,031,738 A | 2/2000 | Lipa |
| 6,166,513 A | 12/2000 | Hammond |
| RE37,128 E | 4/2001 | Peng |
| 6,229,722 B1 | 5/2001 | Ichikawa et al. |
| 6,236,580 B1 | 5/2001 | Aiello et al. |
| 6,262,555 B1 | 7/2001 | Hammond |
| 6,269,000 B1 | 7/2001 | McCarrol |
| 6,320,767 B1 | 11/2001 | Shimoura et al. |
| 6,340,851 B1 | 1/2002 | Rinaldi |
| 6,377,478 B1 | 4/2002 | Morishita |
| 6,621,719 B2 | 9/2003 | Steiner et al. |
| 6,653,744 B2 | 11/2003 | Stricker |
| 6,679,081 B2 | 1/2004 | Marsala |
| 6,697,271 B2 | 2/2004 | Corzine |
| 6,853,541 B2 | 2/2005 | Anheuer et al. |
| 6,898,095 B2 | 5/2005 | Bijlenga et al. |
| 7,164,201 B2 | 1/2007 | Manz |
| 7,190,070 B2 | 3/2007 | Manz et al. |
| 7,242,584 B2 | 7/2007 | Kroneder |
| 7,307,361 B1 | 12/2007 | Bendre et al. |
| 7,319,594 B2 | 1/2008 | Nicolai et al. |
| 7,423,892 B2 | 9/2008 | Vinciarelli |
| 7,479,757 B2 | 1/2009 | Ahmad |
| 7,705,553 B2 | 4/2010 | Worrall |
| 7,876,561 B2 | 1/2011 | Schnetzka et al. |
| 7,892,670 B2 | 2/2011 | Aiello et al. |
| 7,940,537 B2 | 5/2011 | Abolhassani |
| 8,130,501 B2 | 3/2012 | Ledezma |
| 8,254,076 B2 | 8/2012 | Ledezma |
| 8,279,640 B2 | 10/2012 | Abolhassani |
| 8,451,589 B2 | 5/2013 | Milovac et al. |
| 8,711,530 B2 * | 4/2014 | Ledezma et al. ............... 361/42 |
| 8,760,855 B2 * | 6/2014 | Howes et al. ................ 361/677 |
| 8,902,034 B2 * | 12/2014 | MacLennan ................... 336/60 |
| 8,976,526 B2 * | 3/2015 | Kulkarni et al. ............. 361/700 |
| 2008/0079314 A1 | 4/2008 | Hammond |
| 2008/0081244 A1 | 4/2008 | Hammond |
| 2008/0088186 A1 | 4/2008 | Hammond |
| 2008/0196444 A1 | 8/2008 | Lawes |
| 2009/0021922 A1 | 1/2009 | Popp |
| 2009/0038780 A1 | 2/2009 | Liu |
| 2009/0158757 A1 | 6/2009 | Marsala |
| 2009/0229283 A1 | 9/2009 | Marsala |
| 2010/0073970 A1 | 3/2010 | Abolhassani et al. |
| 2011/0044010 A1 | 2/2011 | Ledezma et al. |
| 2011/0292604 A1 | 12/2011 | Janes |
| 2011/0315354 A1 * | 12/2011 | Johnson .................. 165/104.33 |
| 2012/0044032 A1 | 2/2012 | Sathe et al. |
| 2012/0127673 A1 * | 5/2012 | Ledezma et al. ............. 361/730 |
| 2012/0230843 A1 | 9/2012 | Ravipati et al. |
| 2012/0327602 A1 | 12/2012 | Kulkarni |
| 2014/0252864 A1 * | 9/2014 | Kulkarni et al. ................ 307/82 |

OTHER PUBLICATIONS

Dr. Keith Corzine, "Operation and Design of Multilevel Inverters," Dec. 2003, pp. 1-79.

U.S. Appl. No. 13/792,936, filed Mar. 11, 2013, entitled "Passive Two Phase Cooling Solution for Low, Medium and High Voltage Drive Systems," by Devdatta Kuldarni.

U.S. Patent and Trademark Office, Notice of Allowance mailed Nov. 6, 2014 in U.S. Appl. No. 13/606,526.

* cited by examiner

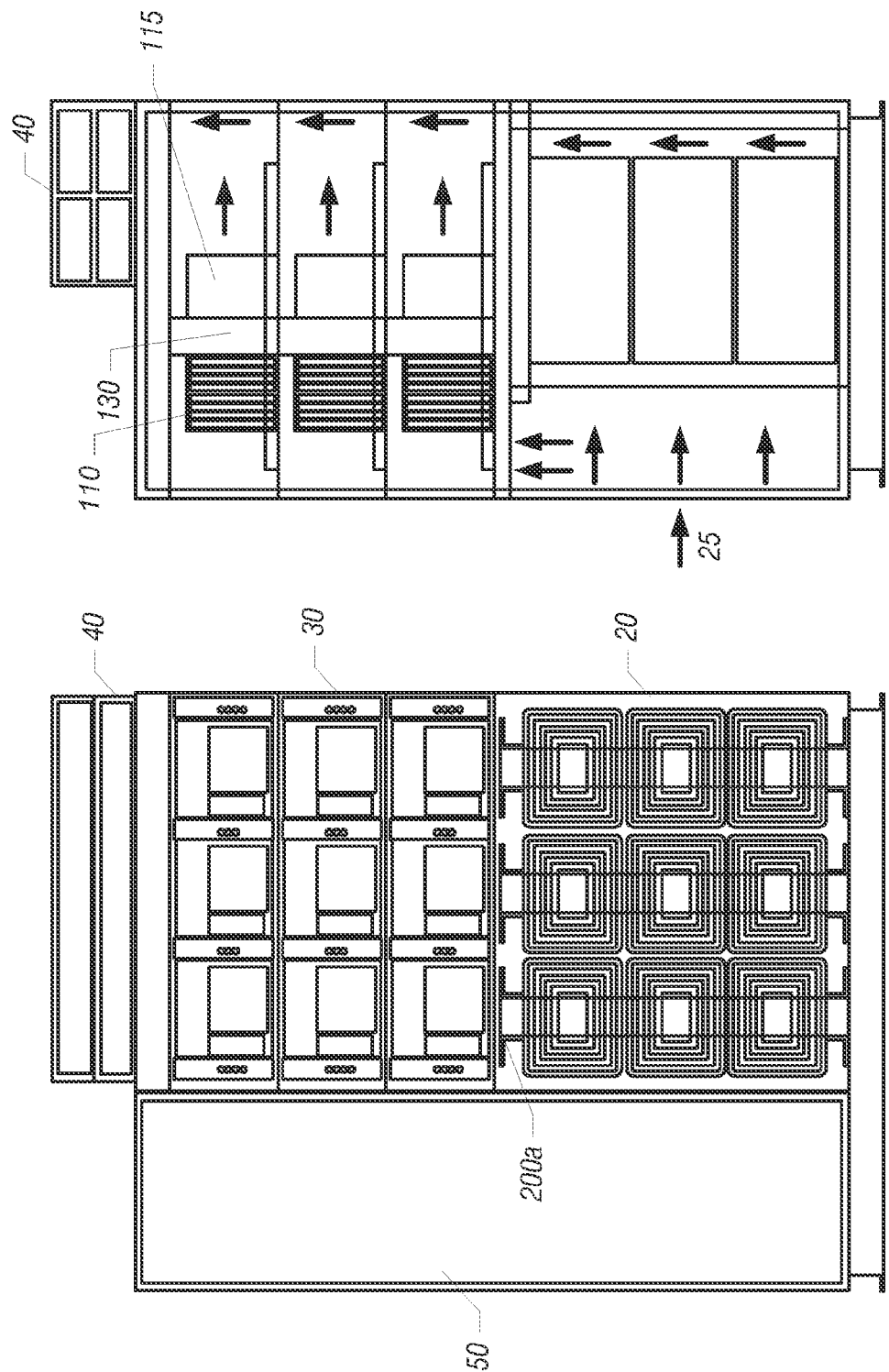

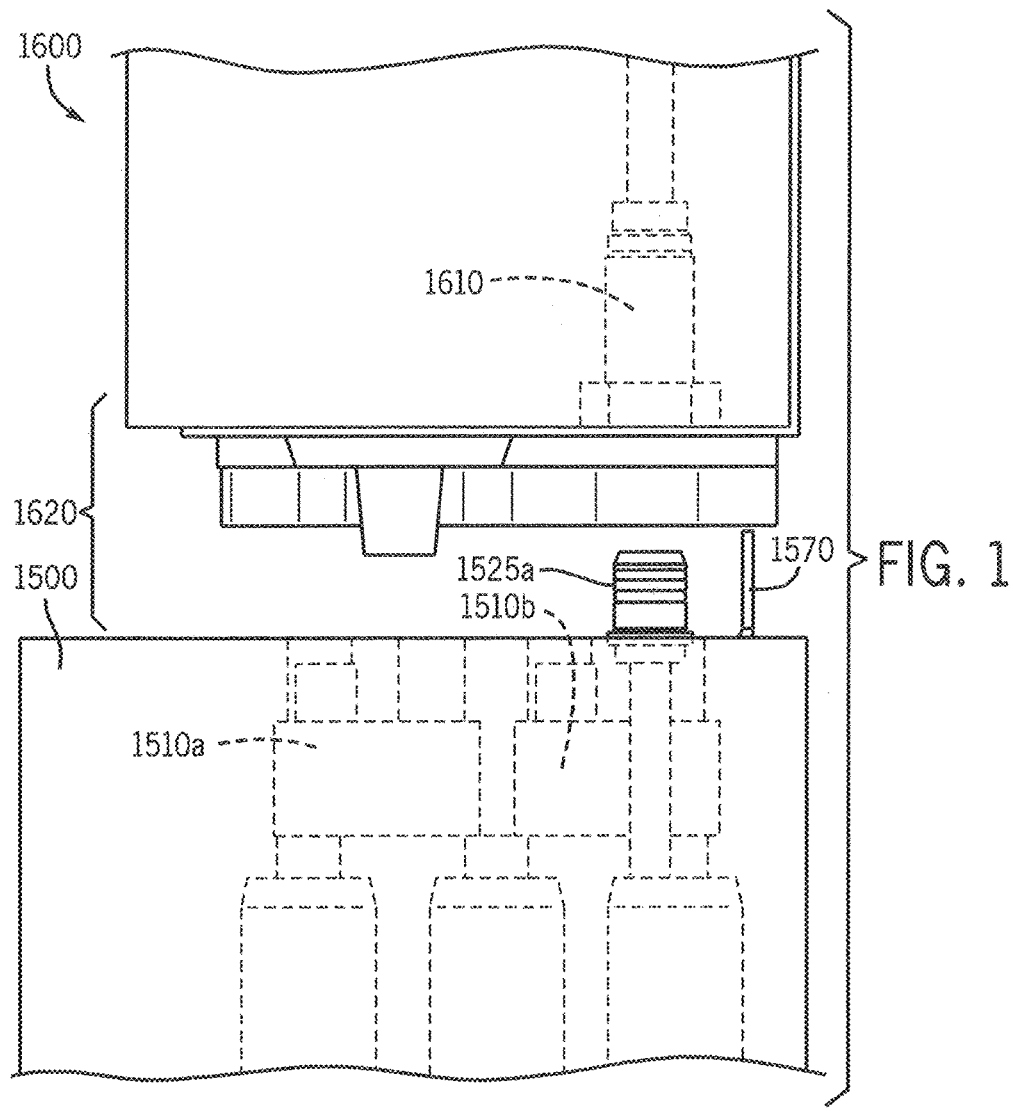

COOLING ARRANGEMENTS FOR DRIVE SYSTEMS

BACKGROUND

Generally, equipment referred to as a power converter, inverter or drive is used to provide power to another piece of equipment such as a motor. Specifically, such a converter (converter is used generally herein to refer to converters, inverters and drives) is coupled to a utility connection to receive incoming input power such as three-phase AC power. The converter conditions the power to provide a conditioned power to the equipment or load. In this way, incoming power to the load may be of improved efficiency, leading to reduced costs to operate the equipment.

Multi-level power converters have been gaining popularity mainly due to improved input and output harmonics content, better electromagnetic compatibility, and higher voltage capability. These improvements in power conversion are achieved by using a multiple voltage step strategy. One common multi-level inverter topology is based on H-bridge inverters, in which multiple H-bridge inverters are connected in series. Since this topology consists of series power conversion cells, the voltage and power level may be easily scaled.

Multi-level power converters are used to provide power to a load such as a motor. Oftentimes, such multi-level converters are implemented as a large piece of equipment that is housed in a cabinet that receives incoming power, e.g., from a utility connection, conditions the power and provides it to a coupled load. In general, a drive system includes one or more transformers that have secondary windings that are coupled to individual power cells that perform rectification, inversion, and other conditioning tasks. Typically, to perform these functions each power cell includes a rectifier, DC link capacitor and inverter, among other such equipment, and each such power cell is packaged together into a module.

However, as voltage and power requirements increase in a system, these modules can be relatively cumbersome, bulky and expensive. For example, in medium voltage (MV) applications, such power cells can easily exceed 50 pounds due to the size of the DC link capacitors and other components present. Another drawback of this conventional design of power cells of a drive system includes a costly and complex customized isolation system as voltage levels increase from a few kilovolts to tens of kilovolts. In general, power cells are provided as a fixed enclosed module customized for a given power and voltage level. For example, power cells for 4160V at 1000 HP applications will radically increase foot print and weight over a power cell designed for 3300V at the same output power. In addition, the overall MV converter package must be individually designed to meet a particular power output, such as 5000 HP, 10000 HP, 20000 HP applications, control, and protection specifications.

In current medium voltage drives, a cascaded topology is implemented using a partial modular design. Specifically, the only subcomponent of the system that is common across drive products of a family is the power cell, which as described above contains the power components including inverter, rectifier, and DC-link. Current medium voltage drives have excluded all other system components, including transformers, control, cooling system, communication distribution, packaging, and electrical insulation, from a modular approach. Instead, these major components are optimized for voltage and power rating of a specific design and thus are not easily transferable to other drive ratings.

Many drive system are provided with an air-based or water-based cooling system. While suitable for many applications, such systems suffer from high costs, reduced efficiency, and size limitations.

SUMMARY OF THE INVENTION

In an embodiment, a drive system includes a cabinet having slices where the cabinet includes a power cube bay and a transformer bay. The power cube bay includes: a first portion having a plurality of cube chambers each having a protective enclosure in which to house one of a plurality of power cubes, each of the power cubes including an inlet port to receive a flow of liquid coolant and an outlet port to output a flow of two phase coolant; and a second portion to accommodate at least a portion of a cooling system for the drive system. This cooling system is a two phase system and includes an inlet conduit coupled to a plurality of first connection members each to connect to a corresponding inlet port of one of the power cubes to enable the flow of liquid coolant to the corresponding power cube, and an outlet conduit coupled to a plurality of second connection members each to connect to a corresponding outlet port of one of the power cubes to enable the flow of two phase coolant from the corresponding power cube. In turn, the transformer bay is to house at least one transformer to couple between a utility connection and the power cubes, and which is to output a plurality of phases of output power. In addition, the transformer bay is to further house a heat exchanger to enable heat exchange with the flow of liquid coolant.

In one example, a plurality of fans are adapted about the transformer, where a first fan is adapted to a first side of the transformer adjacent to a first winding of the transformer, and second and third fans are adjacent to the heat exchanger. In this arrangement, the first fan is to cause a flow of air towards second and third windings of the transformer and the second and third fans are to cause a flow of air towards the first winding of the transformer. In an embodiment, the transformer is a fluid filled transformer, and the heat exchanger is adapted within an enclosure of the transformer such as on a top portion of the transformer.

In another example, a drive system includes a transformer having a primary winding to receive power from a utility connection and a plurality of secondary windings, where the transformer is enclosed in an enclosure including a first heat exchanger to cool an oil medium. In addition, the system includes a plurality of power cubes each coupled to one of the plurality of secondary windings and including a rectifier, a DC-link, and an inverter. Each power cube may include a plurality of cold plates each coupled to a corresponding switching device of the inverter, an inlet port in communication with a first one of the plurality of cold plates and an outlet port in communication with a last one of the plurality of cold plates. In turn, a manifold assembly is to support an inlet conduit and an outlet conduit and further to support a plurality of first connection members to enable mating of each of the first connection members to the inlet port of one of the power cubes and the enclosure and to enable mating of each of the second connection members to the outlet port of one of the power cubes and the enclosure to enable two phase cooling of the power cubes and the transformer.

In yet another embodiment, a drive system includes a plurality of slices configured within a cabinet. Each of the slices includes, in an example: a transformer having a primary winding to receive power from a utility connection and at least one secondary winding; a first heat exchanger adjacent to the transformer to enable heat exchange with the transformer, where the first heat exchanger is coupled to an inlet conduit to receive a flow of liquid coolant and coupled to an outlet conduit to output a flow of two phase coolant; a plurality of power cubes each coupled to the at least one secondary winding and including a rectifier, a DC-link, and an inverter, where each power cube includes a plurality of cold plates each coupled to a corresponding switching device of the inverter, an inlet port in communication with a first one of the cold plates and an outlet port in communication with a last one of the cold plates; a manifold assembly to support the inlet conduit and the outlet conduit and further to support a plurality of first connection members and a plurality of second connection members to enable mating of each of the first connection members to the inlet port of one of the power cubes and each of the second connection members to the outlet port of one of the power cubes to enable two phase cooling of the power cubes; and a second heat exchanger to receive a flow of two phase coolant from the outlet conduit and to enable heat exchange and to provide the liquid coolant to the inlet conduit. In embodiments, this second heat exchanger is external to the cabinet.

BRIEF DESCRIPTION OF THE DRAWINGS

FIG. 7A is an illustration of a cabinet in accordance with one embodiment of the present invention.

FIG. 7B is a side view of the cabinet that illustrates air flow for cooling in accordance with an embodiment of the present invention.

FIG. 14 is an illustration of coupling of a power cube to a manifold assembly in accordance with an embodiment of the present invention.

DETAILED DESCRIPTION

In various embodiments, a power cell chamber can be separated into multiple portions, namely a stationary or fixed portion and a moveable portion. These different portions may be joined by a power service bus. In this way, a module or other housing or enclosure that forms the moveable portion can be made to be relatively small and lightweight as compared to a conventional power cell. This allows for greater ease of customer access and removal, repair and replacement operations on these moveable portions of a power cell. In turn, the moveable portion may be plugged into a power service bus that couples the moveable portion with the fixed portion within the power cell chamber. The fixed portion of the chamber may include various components that would conventionally be present in a single power cell enclosure including, for example, a DC link by way of one or more capacitors. As such components can be relatively reliable over a number of years, these components present in the fixed portion may be provided on an opposite side of the power service bus from the moveable portion. As used herein, "fixed" or "stationary" means that a component is physically attached directly within a cabinet, not readily customer accessible, and cannot be inserted and removed by simple pluggable/slidable means. Instead, special access and tools are needed to insert or remove the component. In contrast, "moveable" or "pluggable" means a component or group of components that are easily inserted and removed from a cabinet, e.g., via sliding, plugging and so forth without the need for tools, and having ready customer access.

Embodiments may provide for a modular cabinet-based drive system that can be used to provide regulated power at a wide range of voltages. For example, some applications may be used for low voltage (LV) applications. As used herein, low voltage is used to denote voltages of 600 volts and below. Others may be used for medium voltage (MV) applications. As used herein, medium voltage is used to denote voltages between approximately 600 volts and 35000 volts. Still further, owing to the separation between components of a conventional power cell and isolation afforded within a cabinet (as discussed below), embodiments also may be readily used for high voltage (HV) applications. As used herein, high voltage means greater than 35000 volts, e.g., 69000 volts.

Figure 1:
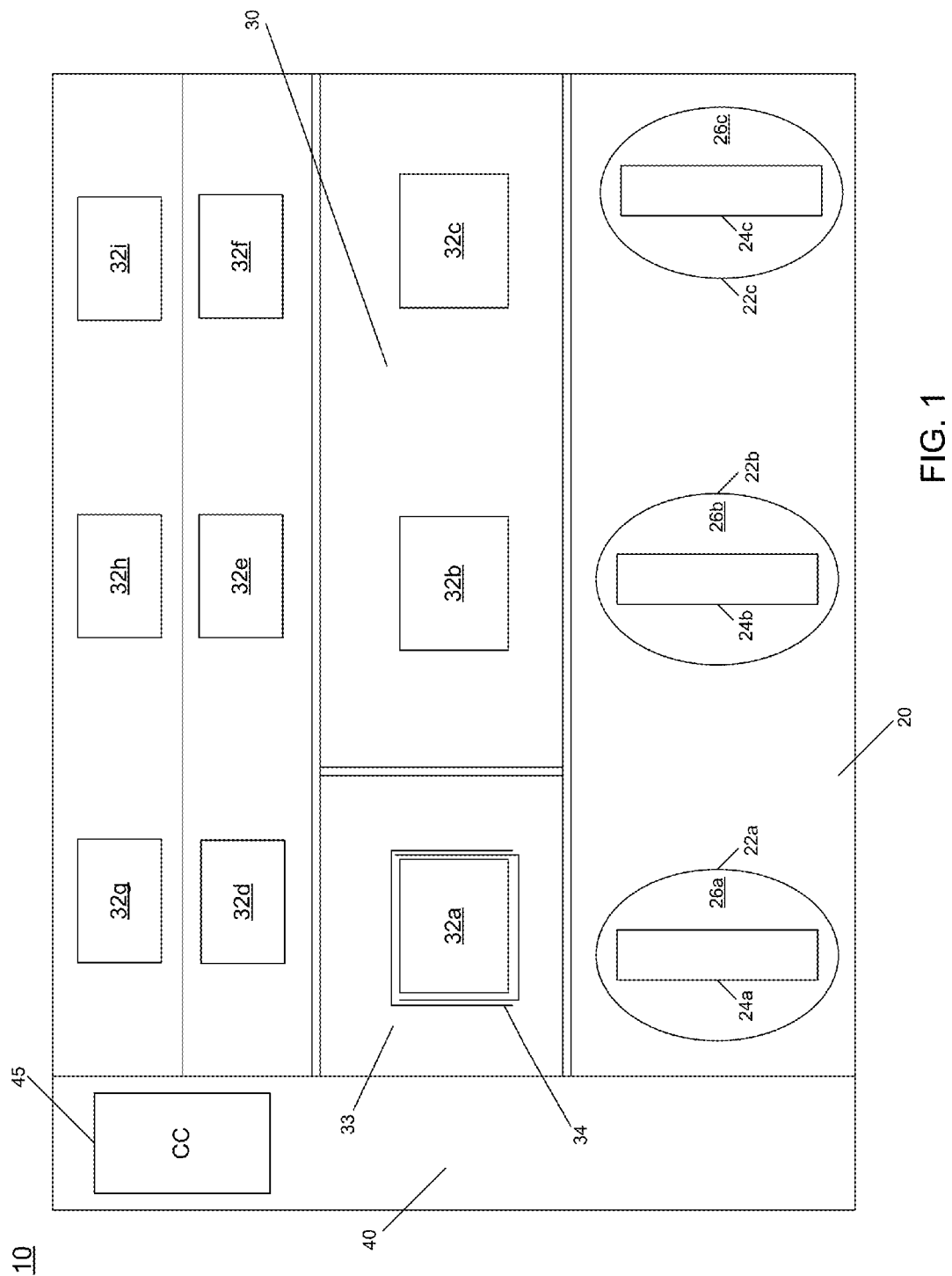
FIG. 1 is a block diagram view of a drive system adapted in a cabinet in accordance with one embodiment of the present invention.

Referring now to FIG. 1, shown is a block diagram view of a power cell cabinet in accordance with one embodiment of the present invention. As shown in FIG. 1, cabinet 10 may house at least a portion of a drive system such as a medium voltage drive system that can be a multi-level inverter. The view of FIG. 1 is with respect to a front portion of the cabinet. In general, the cabinet is arranged such that a plurality of transformers $22_a$-$22_c$ are present in a transformer bay 20, which may be configured in a lower portion of cabinet 10. In turn, a plurality of power cells $32_a$-$32_i$ may be configured within a power cell bay 30 of cabinet 10. In the embodiment shown in FIG. 1, nine such power cells are present, although the scope of the present invention is not limited in this regard. Also, while shown as single modules in the view of FIG. 1, understand that the portions of the power cells shown in FIG. 1 may correspond to the moveable portions adapted within enclosures. Unseen in FIG. 1 are the fixed portions of the power cell modules, which may be adapted to a rear portion of a power service bus, also not shown in FIG. 1.

In some implementations, a single modular power cell cabinet may be sufficient to provide desired power levels for a given system. In such implementations, a cabinet controller 45 present in a controller bay 40 may be used to handle control of the drive system. However, many embodiments may aggregate a plurality of power cell cabinets with a respective cabinet controller 45 along with a single master controller cabinet 40 to control the cabinet arrangement and increase the power capabilities. In these implementations, controller bay 40 including cell controller 45 may in turn be coupled, e.g., via a fiber optic interface to a master controller cabinet (not shown in FIG. 1). Furthermore, in implementations in which a single power cell cabinet is present, a separate cabinet may provide a user interface. That is, to provide user access to information regarding a drive system, a user interface may be present. Such user interface may include a display and an input mechanism such as a key pad or keyboard to enable user input of information and control of various operations including diagnostics and so forth. In other implementations, a master controller cabinet may include such a user interface.

With reference to the transformers of FIG. 1, each transformer may be configured in a horizontal manner having a core 24 and multiple windings adapted there around, including a primary winding and a set of secondary windings. In addition, some embodiments may further include one or more auxiliary windings to provide power to auxiliary equipment such as fans or the like. Each transformer 22 may be a three-phase transformer that receives three-phase power from a utility connection and provides power to one or more of the power cells (although only a single phase is shown in FIG. 1). More specifically, each transformer may include three sets of secondary windings to provide power to a corresponding power cell. In one implementation transformer 22a may provide power to the power cells with which it is generally vertically aligned with, namely power cells 32a, 32d, and 32g. Similar connections can be configured for transformers 22b and 22c. However, other implementations are possible. Note that the primary windings, secondary windings or both may be phase-shifted in some implementations.

By providing transformers in a generally horizontal configuration, improved airflow is realized. For purposes of cooling the transformers and the cabinet in general, a substantially linear and laminar airflow may be provided, e.g., from forward to rear of the cabinet such that the air blows through the windings of the transformers. While ambient air cooling can be used in many implementations, some embodiments may provide some type of liquid cooling for the transformers as well. Further details regarding the horizontal nature of the transformers will be discussed below. Note that in other embodiments, the coils of transformer may be in a vertical configuration. And, as described below the transformer can be enclosed in a fluid-filled enclosure, where the fluid is an oil or an engineered fluid.

As further seen in FIG. 1, each power cell chamber 33 (i.e., both the moveable and fixed portions) can be configured as an enclosure (only one representative such chamber shown in FIG. 1). Such cell chamber can be formed using an insulative material such as a polypropylene or other plastic or other such material. Still further, to provide electrical isolation between the power cells and other equipment in cabinet 10, an isolation barrier 34 can be provided in each chamber (note only one such isolation barrier 34 is shown). As seen, isolation barrier 34 is formed of a plurality of individual members in an interlocking manner or single involving member as shown in FIG. 7A to provide efficient isolation. In various embodiments, isolation barrier 34 may be formed of sheets of an insulating material such as FORMEX™ or other such material. While shown with only a few such members for ease of illustration in the embodiment of FIG. 1, understand that many such members, e.g., 2 or many more may be provided, as these individual members can be of relatively thin width, e.g., 9.8 to 125.2 mils. In this way, an insulating bubble is formed around each power cell to facilitate voltage insulation. Such insulation may enable a single generic cabinet architecture to be used with a wide variety of voltages, from low voltage applications all the way up to high voltage applications. Generally as the voltage application increases, the number of sheets and thus relative thickness may also increase. Further, while not shown for ease of illustration in FIG. 1, understand that spacers may be present to provide separation of the individual power cell chambers from a base over which they are situated.

Understand that while shown with this particular implementation in the embodiment of FIG. 1 with the power cells configured above transformers, the scope of the present invention is not limited in this manner. Furthermore, understand that additional components may be present in a given drive system, and the illustration of FIG. 1 is at a high level to identify the main components and their general location within a system.

Figure 2A:
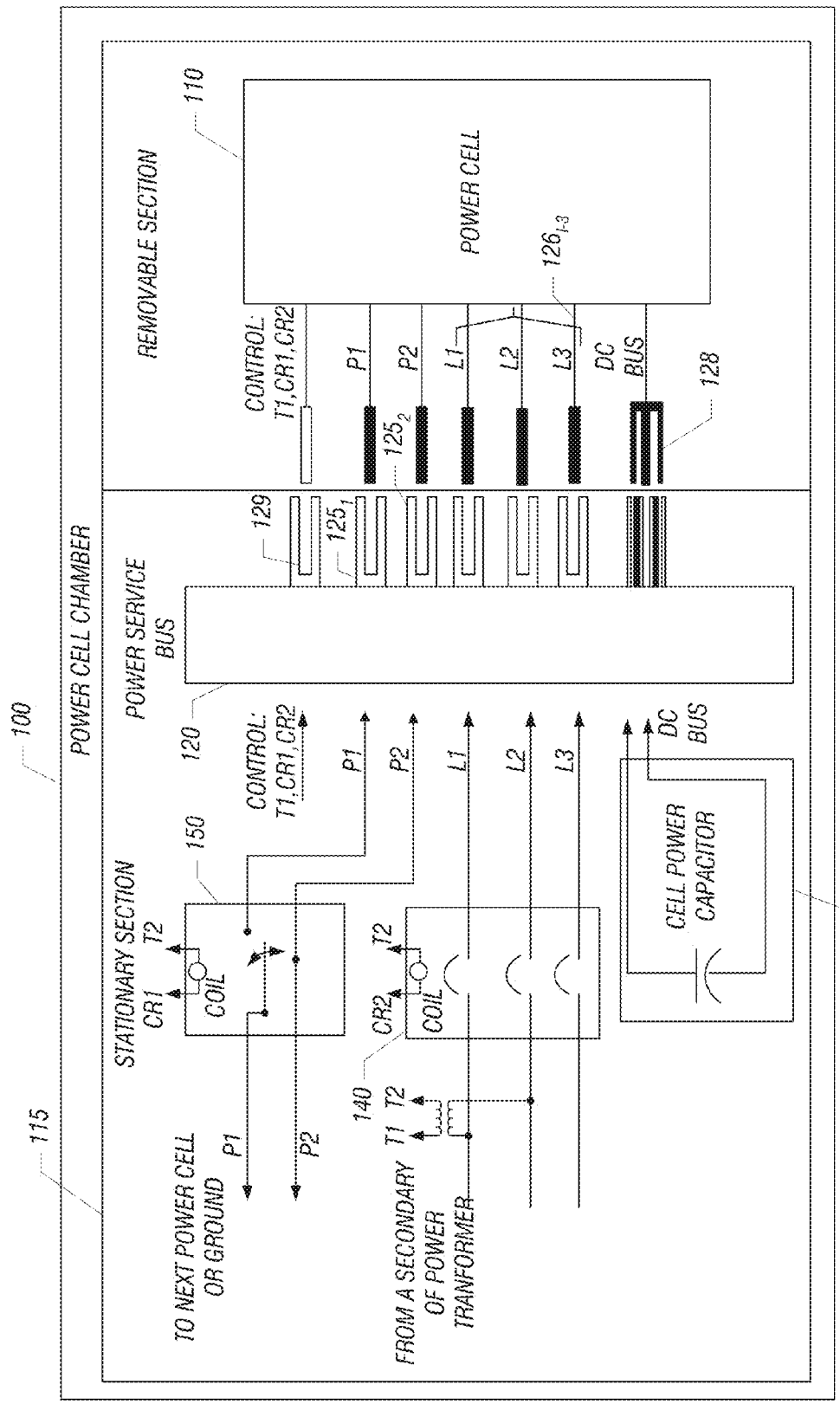
FIG. 2A is a schematic diagram of components within a power cell chamber in accordance with one embodiment of the present invention.

Referring now to FIG. 2A, shown is a schematic diagram of components within a power cell chamber in accordance with one embodiment of the present invention. As shown in FIG. 2A, chamber 100 is adapted to include both the fixed and moveable portions. A given drive system may include multiple such chambers to form the drive system. In various implementations a power cell module 110 may correspond to the moveable portion of the power cell chamber and may be accessed via a front panel of a cabinet, whereas a fixed portion 115 of the chamber may be accessible via a rear panel of the cabinet or via a front panel when the cell module 110 is not present or is otherwise removed. Thus as shown in FIG. 2A, from right to left generally corresponds to a direction from a front to a rear of a cabinet. Details of the movable power cell are described further below. In general, the moveable portion may include the rectification and inverter stages of a cell (but not the DC-link power capacitor).

Power cell module 110 may couple to a power service bus 120 via a plurality of pluggable terminals located on a back portion thereof. Power service bus 120 may have various connectors to mate with the terminals of power cell module 110. In some embodiments, power cell module 110 may be installed via blind mating connections with corresponding connectors of power service bus 120. As will be described below, power cell module 110 may include a rectifier section and an inverter section. The rectifier section may include a plurality of diodes coupled to the inputs from the transformer secondary, along with at least one parallel-connected local capacitor that in turn is coupled to a local capacitor low inductance bus. Similarly, the inverter section may be, for example, an H-bridge inverter including a plurality of switching devices such as IGBTs and further may include a parallel-connected local capacitor. The local capacitor may provide diagnostics and snubber protection capability to the power cell. In different implementations, this capacitor may be sized from a few tens to a few hundreds of nanofarads. In turn, the inverter section is also coupled to the local capacitor low inductance bus. This bus may be constructed in a manner to provide a low inductance path. In various embodiments, the inductance may be between a few nanohenries to less than 20 nanohenries and the bus may be formed from a laminate material and provide connections between these two sections in a low inductance manner.

In a given implementation, power cell module 110 may be formed having dual cooling plate heat sinks, e.g., on top and bottom. In various implementations, various controller boards may be present in module 110. One of the boards provides gate signals to control the H-bridge inverter, while a second board provides input current and DC bus voltage sensing capability for the power cell. A third board may be in communication with these controller boards and may be also implemented within the plug-in section of the cell chamber 110 and which in turn can be coupled via a fiber optic interface to the respective cabinet controller. A power supply also may be present within module 110, and which may be used to provide a low voltage supply to, e.g., the internal cell controller boards.

In the embodiment shown in FIG. 2A, input, output, DC bus, and control signal connections of a power cell may be provided via a number of blind mating connectors to couple to bus 120. In the embodiment of FIG. 2A the connectors may be cyclindrical-shaped male/female plug connectors that can provide high current density and minimal spacing, although other implementations are possible, as described below. Note that bus 120 may also include a DC low inductance bus. In general, this bus may use at least some of the following to enable a low inductance connection: the bus may be formed of a laminate material, e.g., multiple copper sheets and an insulation sheet to provide electrical isolation to the arrangement. As seen in FIG. 2A, the AC output of the power cell is connected using plug-in connectors $125_1$ and $125_2$. In turn, an input connection to the cell from secondary windings of a transformer may be coupled to power cell 110 via connectors $126_1$-$126_3$ (in a three-phase implementation). In turn, a DC bus connector 128 may couple a DC bus link between power cell 110 and a capacitor 130. In one embodiment, connector 128 may be formed of a single connection having a plurality of concentric fixed connectors to mate with concentric fixed terminals to connect to a low inductance DC bus. The concentric connector 128 may connect to a cell DC-link power capacitor 130 and which is implemented in a fixed portion 115 of the power cell chamber formed on the opposite side of power service bus 120. The capacitor thus may be a remote capacitor with respect to the moveable power cell. In one such implementation this concentric connector may be a type of coaxial cylindrical cable that reduces the DC bus inductance. In other embodiments, low inductance may be realized by providing a number of connections for the positive and negative portions of the DC bus, e.g., four connectors in parallel, arranged horizontally or in any other pattern, two each for positive and negative portions. Note also a control connector 129 may provide various status and control signals through power service bus 120.

In one embodiment, capacitor 130 may be a single film power capacitor or a plurality of single film capacitors connected in series or parallel or a combination to fit a specific cell design. The capacitor configuration may range from thousands of microfarads to tens of thousands of microfarads and from a few tens to a few hundreds of amperes rms. The capacitor configuration 130 may operate from a DC bus which may be rated from a few hundred volts to several thousands of volts. Other implementations may use electrolytic or other type of capacitors. Each individual capacitor may further be associated with a discharge resistor. As shown in FIG. 2A, a discharge/ground system may be realized as a resistive divider formed of series resistors R1 and R2 having an intermediate node coupled to ground, which may be a floating ground connection to the frame, such that only half of the voltage may be discharged to ground during a fault. More than one such capacitor may be present, and thus the term "capacitor" as used herein refers to a combination of one or more capacitors. Capacitor configuration 130 may also be located on top or bottom of the moveable section of the power cell chamber but within the cell chamber.

In addition, fixed portion 115 may further include an input cell protection mechanism 140 such as circuit breakers or other protection mechanisms e.g., fuses to couple between the secondary windings of a transformer and power service bus 120. The input cell mechanism protection 140 may provide reliable short circuit protection and overload protection within a few 60 Hz current cycles. The control trip scheme to operate mechanism 140 (not shown) may be implemented in moveable portion 110. Not shown in the embodiment of FIG. 2A are various control and switching signals that may couple between a cell and a master or cabinet controller (which may be outside of a given power cell chamber, but present in another part of a cabinet, for example). As further shown in FIG. 2A, a control transformer, which may be a fuseless transformer, can be coupled to multiple phases of the incoming signals from the power transformer secondary. This transformer provides protection and can withstand short circuit fault currents in a safe manner. Note that T1 and T2 are secondary terminals of the fuseless transformer, and can be used to activate the circuit breaker and bypass shunt trip coils and provide control power to the cell mobile section.

In addition, a cell bypass block 150 may be provided in fixed portion 115, which may provide redundancy power/bypass to a given power cell in a cell failure mode. This mechanism may be implemented using a shunt trip contactor controlled from a cabinet controller via the plug-in section and service bus. For example, during operation when a power switch failure is detected by signals sent to a master controller, the master controller may act to actuate block 150 to thus create a short circuit between the outputs of a power cell having a failure. With reference to FIG. 2A, by actuating a coil within bypass block 150, a short circuit between terminals P1 and P2 can be realized to thus bypass this power cell in case of a malfunction. For example, if power cell 32g (of FIG. 1) is disabled due to a failure in phase A, power cells 32d and 32a may be also disabled in phases B and C via the master controller to allow the drive system to continue functioning at reduced power and balance voltage output.

In one embodiment, block 150 may be an electronic switch coupled via a latching relay to a cabinet controller (not shown). The latching relay thus acts to take the signals from the cabinet controller and automatically control switching of bypass block 150 to open and close to thus provide bypass by responding to a fault command or other adverse condition. Similar connections may be present between a corresponding latching relay and input cell protection mechanism 140 to cause the breaker or other protection mechanism to be enabled to thus prevent input power from being applied to a given power cell. For instance, if a failure occurs in the rectifier section and detected by a current sensor located in the cell input (not shown in FIG. 2A), the input protection mechanism 140 may disable the power to the cell via 140, followed by the actuation of bypass block 150 to isolate the troubled cell. Under this scenario, a master controller may act to disable the entire drive system or bypass this cell to continue operation at reduced power. In some implementations the connection between the cabinet controller and latching relay or shunt trip circuit may be via fiber optic, although the scope of the present invention is not limited in this regard.

The structure of power service bus 120 holds concentric DC bus and other terminal mating accesses (plug-in style). Power service bus 120 may integrate bus bars for cell series output, bus bar for cell input, a low inductance laminated DC bus to connect to the DC-link power capacitor(s), and a G-10™ material to provide structural support and insulation between electric buses. In this way, series coupling of a group of power cells can occur to provide a phase output line to a load coupled to the drive system. In different implementations, the service bus can be formed using a division wall (e.g., G-10™ material) or an open structure to provide for air circulation.

Figure 2B:
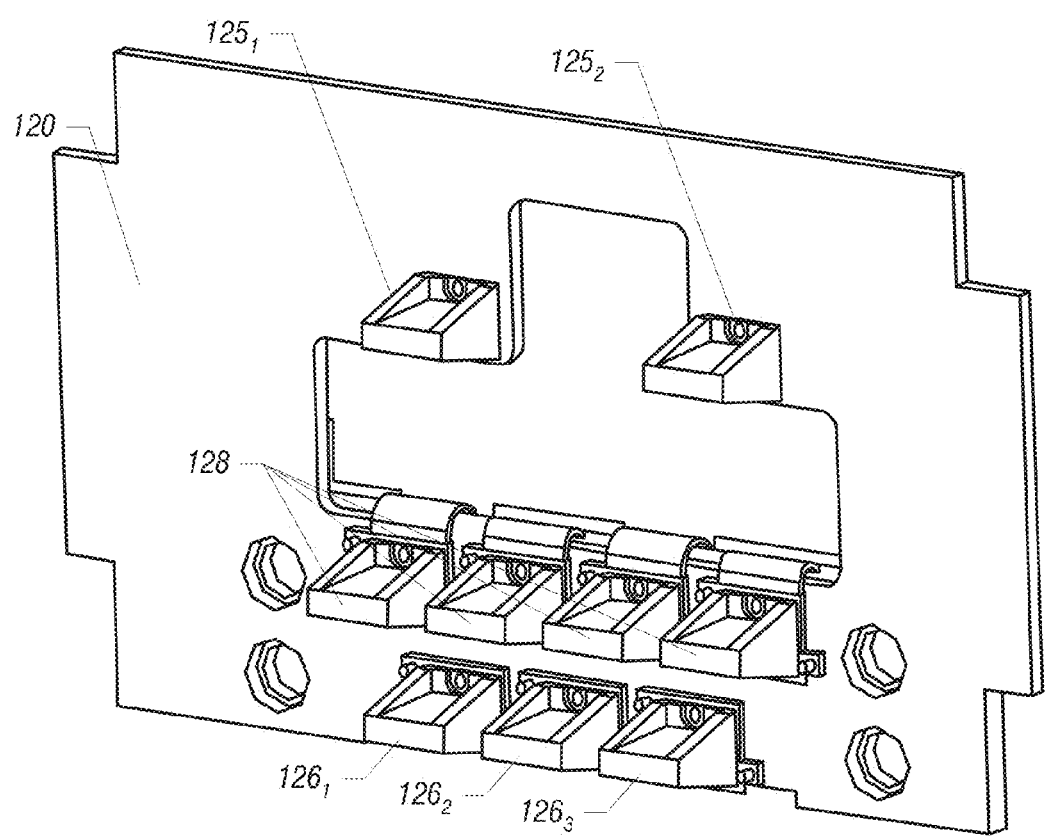
FIG. 2B is a block diagram illustrating connections available in a power service bus in accordance with an embodiment of the present invention.

Referring now to FIG. 2B, shown is a 3-D mechanical model illustrating connections available in a power service bus in accordance with an embodiment of the present invention. As shown in FIG. 2B, power service bus 120 may be formed using insulation material, e.g., G-10 and includes contacts for cell input, output, DC link, and control signals (not shown). Specifically as seen in FIG. 2B, at a top portion of power service bus 120, the cell outputs P1 and P2 may be adapted. Furthermore, the three connections L1-L3 at a bottom of the power service bus may provide the inputs from secondary windings of a transformer, while the DC link connections 128 may be provided via four individual connections, two positive and two negative. In other embodiments only a single positive and negative connection may be provided.

Figure 2C:
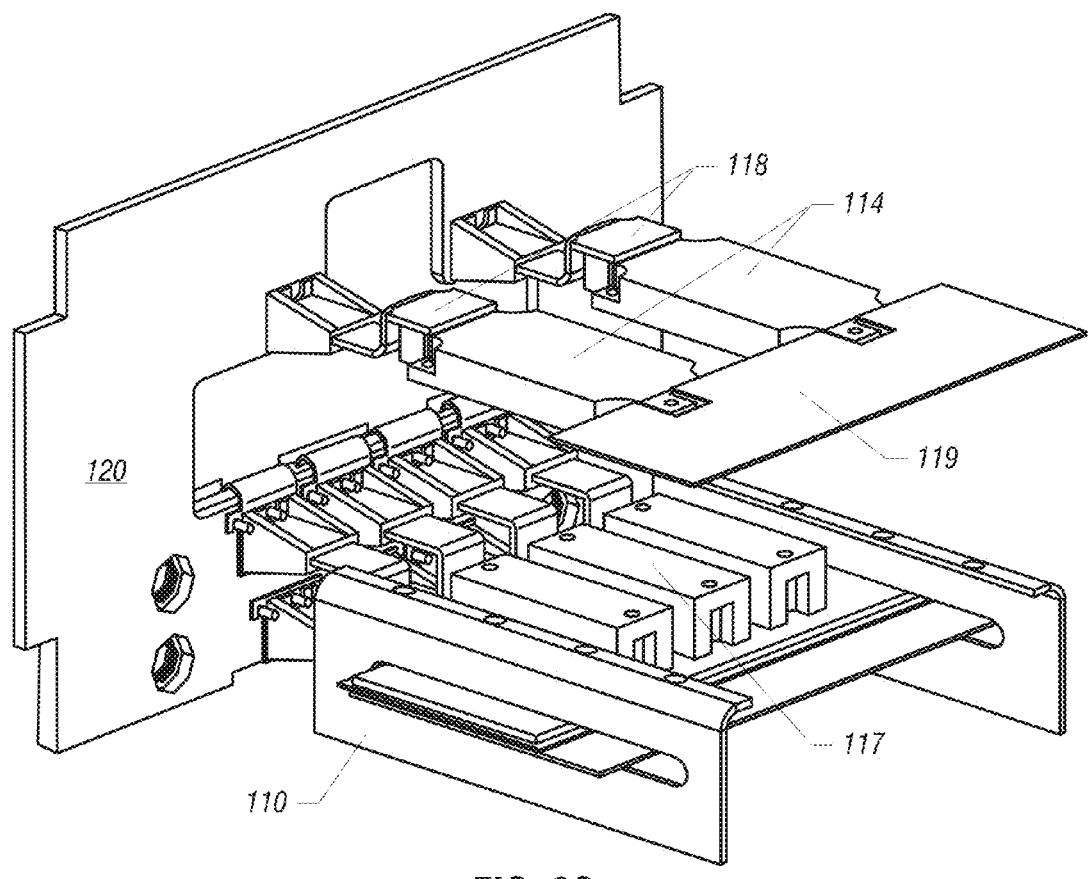
FIG. 2C is another view of a power service bus in accordance with one embodiment of the present invention.

Referring now to FIG. 2C, shown is another view of the power service bus that shows part of a moveable portion of a power cell chamber that provides connections to the cell inputs, outputs, as well as the DC link laminated buses in the moveable portion. Note that on the top portion of moveable module 110, a plurality of switching devices 114, which may be IGBTs are seen, while rectification devices 117 are present at the bottom of the cell. Switching devices 114 may be coupled between a laminated DC bus 119 and bus bars 118. As also seen in FIG. 2C, the output from a power cell is routed via connectors P1 and P2 from bus bars 118. Connectors P1 and P2 may provide connection to another power cell with which power cell 110 is coupled in series, namely another power cell of the same phase output line. Note that in some embodiments, rather than the flat connectors shown, cylindrical connectors such as shown in FIG. 2A may be used.

While shown with this particular implementation in the embodiment of FIGS. 2A-C, the scope of the present invention is not limited in this regard. For example, while it is assumed in this embodiment that power cell moveable portion 110 may not include the components of fixed portion 115 described above, in some implementations, a limited amount of local capacitance available in the power cell may be combined with the fixed capacitance present in the fixed portion within the power cell chamber in accordance with an embodiment of the present invention.

Figure 2D:
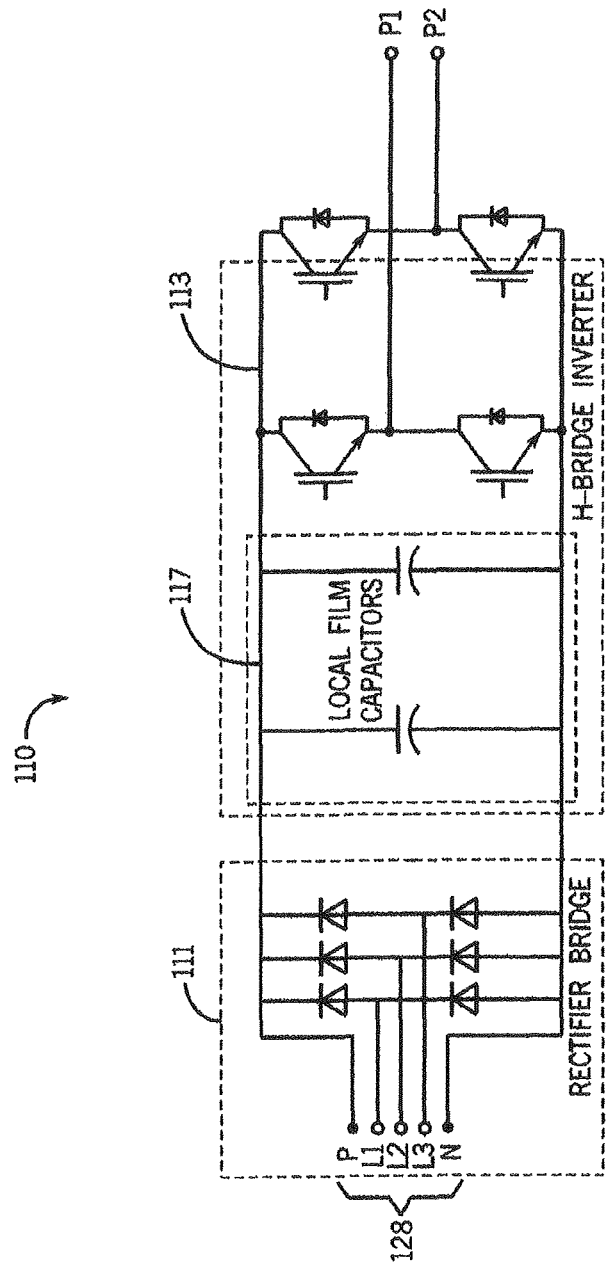
FIG. 2D is a schematic diagram of a power cell mobile section in accordance with an embodiment of the present invention.

Referring now to FIG. 2D, shown is a schematic diagram of a power cell chamber in accordance with an embodiment of the present invention. More specifically, shown in FIG. 2D are the components of the moveable portion of the power cell chamber. Specifically, the moveable portion 110 includes a rectifier bridge 111 and an inverter 117 which may be formed as an H-bridge inverter. In addition, a set of local capacitors 113 may be present and coupled between rectifier bridge 111 and inverter 117. Note however that these local capacitors (which in one embodiment may be film capacitors) do not provide sufficient capacitance to the DC bus of the power cell. Instead, the local capacitors, which may be on the order of between 100 and 200 microfarads, can be used for purposes of bench diagnostics (single cell) and snubbing of transients for the IGBTs of inverter 117 during medium voltage operation.

However, these capacitors provide insufficient capacitance to properly operate the inverter drive at a desired medium voltage level. Instead as seen, connectors P and N, which may form a DC bus 128 may receive the DC voltage from the cell power capacitor (e.g., capacitor 130 of FIG. 2A) that is present in the stationary section of the cell. Note that connections L1-L3 coupled to rectifier bridge 111 may also be received via a power service bus, e.g., from a power transformer secondary as shown in FIG. 2A. In turn, the regulated output from moveable portion 110 may be output to the stationary section via connectors P1 and P2, which as shown in FIG. 2A may pass through power service bus 120 where the voltages can be provided to a next power cell (for example). Thus in contrast to a conventional power cell, the components shown in FIG. 2D provide an appropriate output voltage by receipt of DC bus bulk capacitance from the stationary section.

Figure 3:
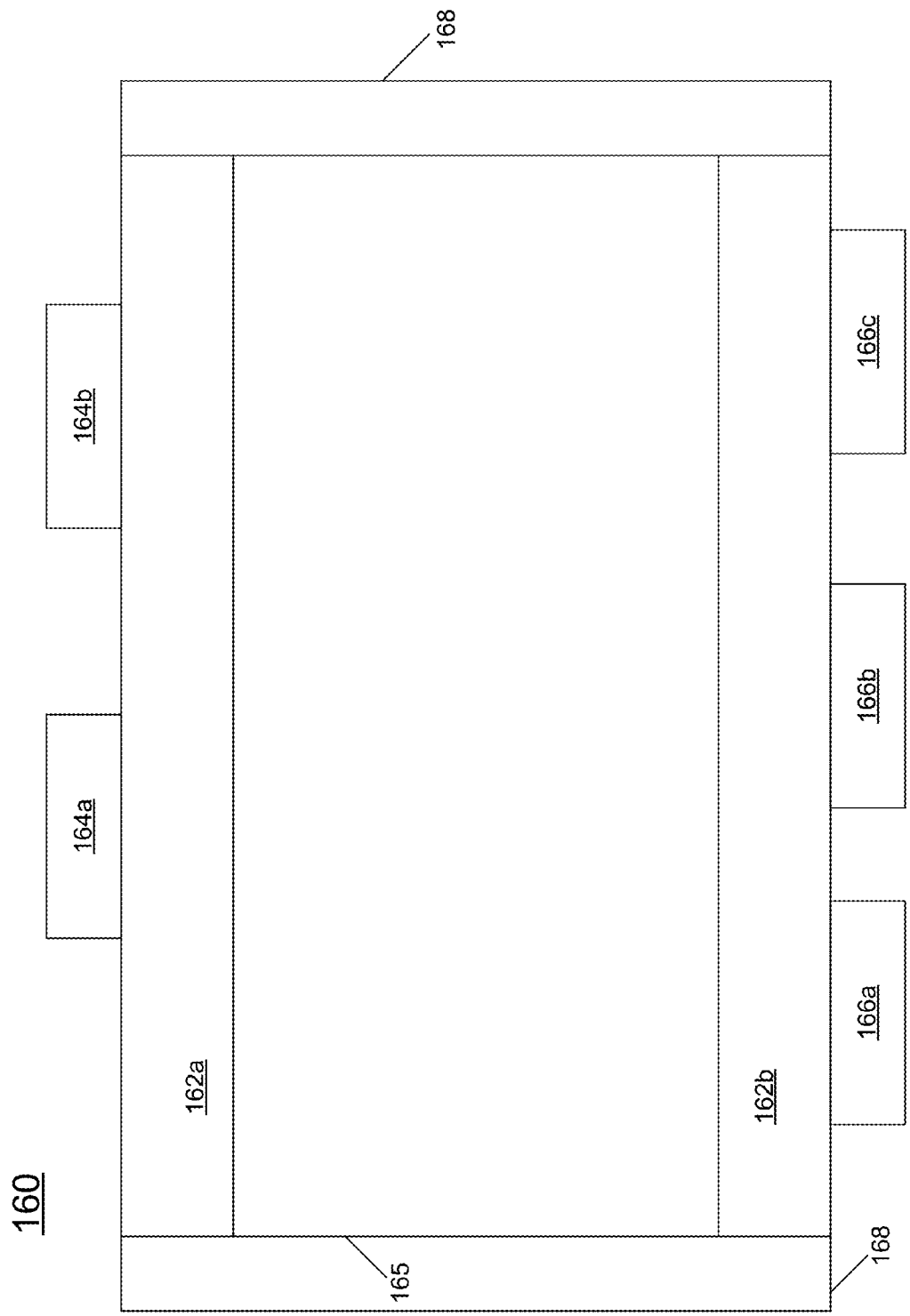
FIG. 3 is a block diagram view of a power cell module in accordance with one embodiment of the present invention.

Referring now to FIG. 3, shown is a block diagram view of a power cell module in accordance with one embodiment of the present invention. As shown in FIG. 3, module 160 may be a basic representation of a removable portion of a power cell. Not shown, an enclosure may be present and which may have various components present therein including, for example a local controller, input current and heat sink sensors, power switch gate drivers and a modular HV power supply. In addition, module 165 includes a split heat sink formed of cooling plate members 162$_a$ and 162$_b$, present on opposite sides of housing 165 to provide for improved thermal control and increased power density for module 160. While not shown in FIG. 3 for clarity, understand that the heat sink members may have a comb, fin, or fan-like structure to efficiently dissipate heat. The heat sink structure may include a cooling plate with a cooling fluid circulating in pipes through the plate with input/output leaving on the same or opposite sides of the housing. Different components can be coupled to the two heat sinks. In the implementation shown in FIG. 3 on a top portion, switching devices of an inverter stage may be present. As an example, switching devices 164$_a$ and 164$_b$ may be IGBTs. While shown in this front view in FIG. 3 as including only two such IGBT dual modules, understand that in various implementations an H-bridge of a power cell may include six-pack IGBT modules, and all of which may be adapted on a top portion of power cell enclosure 165. On the bottom portion, rectification devices 166$_a$-166$_c$ of a rectifier stage may be present. Again, while shown with three such devices in FIG. 3, understand that additional rectification devices may be present in different embodiments. In some embodiments, the rectification section may be replaced by an active front end having six IGBT modules to provide regeneration capability in addition to the rectification. Also, by adapting the major components of the moveable portion of the power cell around an exterior of an enclosure 165, ease of access to the components for heat dissipation as well as increase of power density by maintaining same foot print for a wide range of power and utilizing none or limited DC-link capacitance. This also has a dramatic impact on size and weight reduction, and how diagnostics and removal, repair and replacement operations are realized.

To provide a low inductance path between the rectifier and inverter sections, two local film capacitors 168 that provide local ripple and full DC-link current circulation, may be adapted to the outside of enclosure and coupled to the switching devices and rectification devices by way of corresponding sets of terminals (note the terminals are not shown in FIG. 3). This low inductance path has reduced parasitics and provides an adequate path for DC current circulation, as well as for performing snubbing of transients that may arise during normal operation to improve inverter cell performance. In this way, local capacitors 168 may be used to provide a low inductance path directly between rectifier and inverter to enable smoothing of a noisy signal during normal operation, and diagnostics/testing capabilities for a single cell. That is, in contrast to the one or more capacitors provided in a fixed portion of a power cell chamber which are used to provide the bulk capacitance needed to operate the inverter, the local capacitor(s) can act as snubbing circuitry to filter out unwanted voltage transients present at the inverter terminals. This is particularly so during switching events occurring in switching devices of the inverter. While shown with this simplified view in the embodiment of FIG. 3, understand the scope of the present invention is not limited in this regard.

Figure 4:
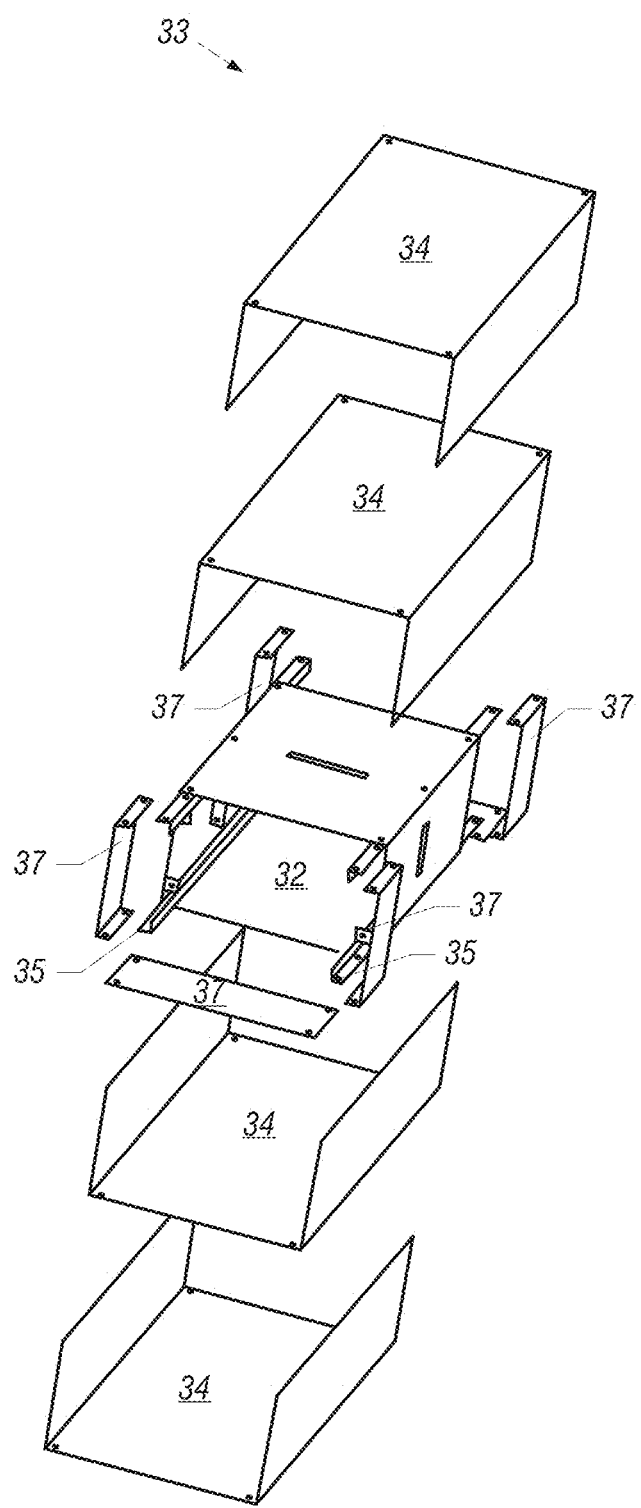
FIG. 4 is a breakaway diagram of a chamber of a power cell cabinet in accordance with one embodiment of the present invention.

Referring now to FIG. 4, shown is a breakaway diagram of a cell chamber of a cabinet in accordance with one embodiment of the present invention. As seen in FIG. 4, chamber 33 includes a power cell insulator portion 32 including rail members 35 at its bottom to allow a movable power cell to be slidably mated into and removed from the chamber. Specifically, rails 35 may enable corresponding rails of the movable power cell to slide. As seen, multiple layers of an isolation barrier 34 may be present to provide insulation to a power cell chamber. In this way, isolation barrier 34 acts as a bubble or cocoon shell in which the power cell chamber is isolated from other equipment of a drive system. The number of layers may depend on a rated voltage of the drive system. For example, depending on the thickness of the individual layers (which can range from less than 1 mm to over 20 mm), operation isolation can exceed 150 kV. In some implementations, 5 or more layers may be provided to enhance isolation. Further, while shown as interlocking members, in other implementations the members can be surrounding or encircling such that each member fully surrounds chamber 33.

In various implementations, the layers of isolation barrier 34 may be present between a perimeter of a chamber and rails 35 of the chamber. As further shown in FIG. 4, additional insulation members 37 may be adapted around the power cell insulator portion 32 to enable improved insulation of the power cell. The staggering discussed above may be implemented in part using these additional insulation members 37 of varying sizes. Note that the length of the layers of isolation barrier 34 may extend beyond the length of the power cell module adapted within chamber 33 to improve isolation. Furthermore, this extended length enables a single modular design to be used with power cells of varying rated voltage applications to enable a single modular design to be used with drive systems having widely different voltage rated capabilities. Still further, when adapted in a stack in a modular drive system, the chambers may be in substantial vertical alignment along one axis but not along another. That is, the chambers can be staggered vertically (with respect to the front/back axis of the cabinet) to provide greater isolation protection with minimum vertical separation between chambers. This configuration can reduce or prevent a corona occurrence and do so with a minimal effect on spacing size of the chambers. For example, the staggering may be between 1 and 2 inches, in one embodiment.

As described above, a cabinet may include a transformer bay, in which one or more transformers are adapted. Such transformers may have a main primary winding, which may be a three-phase medium voltage winding that receives medium voltage power feed, e.g., from a utility connection. In turn, a set of secondary windings each of which may be a three-phase secondary winding may provide normal operating power to the power cells. These secondary windings may be phase shifted, e.g., by 20 degrees from its neighboring secondary winding, however the scope of the present invention is not limited in this regard. In addition to the main windings for powering the power cells during normal operation, a transformer may further include auxiliary windings to enable pre-charging as well as to handle auxiliary functions, such as for diagnostics, voltage sensing, fan power and so forth.

By separating a transformer into modular units, there is more surface area for the core and thus it can dissipate heat more effectively. Further, each modular core volume may reduce in size since the winding window may only need to accommodate one or a small number of secondary windings per output phase. The modular approach allows a single unit transformer to be used across a wide voltage and power range. By increasing the number of modular units, a drive system in accordance with an embodiment of the present invention can be capable of higher voltage and power with lower harmonic distortion.

In one embodiment of a drive system having multiple modular transformers, the amount of phase shift of secondary and primary windings can be calculated according to the following equations:

$$N_S = \frac{N_{dc}}{N_T} \qquad [\text{EQ. 1}]$$

$$\alpha_{sec} = \frac{360}{2 \cdot N_{ph} N_s} \qquad [\text{EQ. 2}]$$

$$\alpha_{prim} = \frac{\alpha_{sec}}{N_T} \qquad [\text{EQ. 3}]$$

where $N_T$ is the number of transformer modules; $N_{dc}$ is the number of isolated DC sources; $N_S$ is an integer number of the number of secondary windings in each transformer; $N_{ph}$ is the number of phases of a supply; $\alpha_{sec}$ is the secondary windings phase shift in each module; and $\alpha_{prim}$ is the primary winding phase shift in each module.

Modular transformers may be manufactured using transformer manufacturing techniques and implementing various types of winding designs for both primary and secondary windings. Primary windings may include both extended delta configurations and a standard delta configuration. However, the connection of primary and secondary windings can be freely chosen. In various implementations, a desired phase shift may be realized by changing the geometry of the winding, e.g., by adjusting the number of turns of one or more coils of the transformer or taps with regard to other coils. By controlling the number of turns of coils and connection method of them, a given phase shift can be realized. Secondary windings can include standard delta configurations, as well as polygon configurations, where again by changing the size and/or turns of one or more coils, different phase shifts can be obtained. Of course, other configurations or connections can be used to realize a desired phase shift in different implementations.

Figure 5:
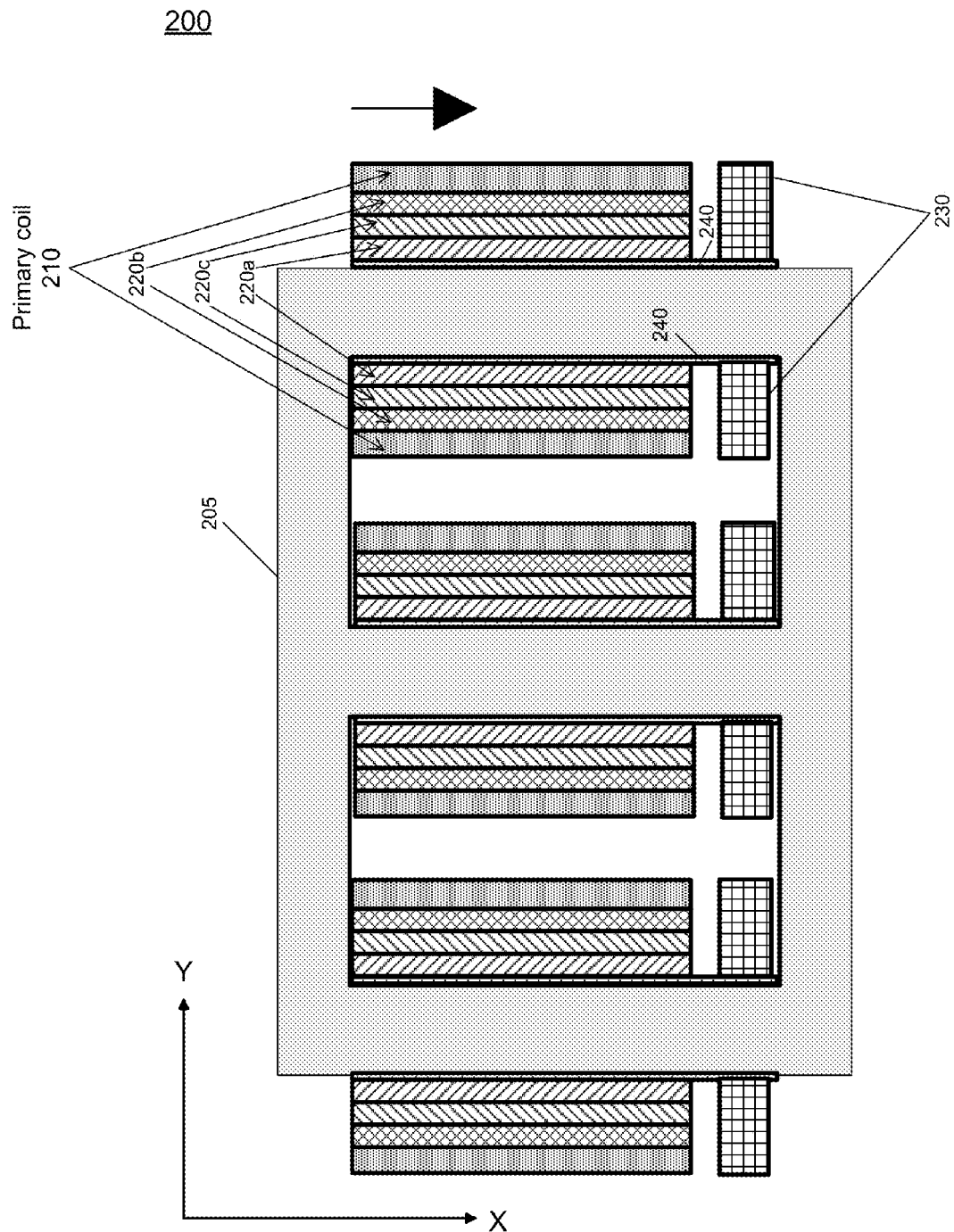
FIG. 5 is an illustration of an example embodiment of a winding geometry of a modular transformer in accordance with one embodiment of the present invention.

As described above, modular transformers may be adapted horizontally to aid in cooling the transfer. FIG. 5 is an illustration of an example embodiment of a winding geometry of a modular transformer. As shown in FIG. 5 is a geometric illustration of a modular transformer 200. As seen, transformer 200 may be a single modular transformer having a generally horizontal configuration (i.e., the windings are wrapped around a horizontal axis X) with a core 205, which may be an iron core having the different windings, both main and auxiliary, wrapped around horizontal columns of the core. Generally, the windings may include a primary coil 210 and a plurality of secondary windings 220. In addition, some implementations may further provide auxiliary power by way of a LV primary auxiliary winding 230 and a LV secondary auxiliary winding 240. However, in some implementations, the auxiliary windings may not be present. Further, the scope of invention is not limited to only a horizontal configuration as this method can be applied to a conventional vertical configuration too.

While FIG. 5 shows a three-phase configuration, and thus having three columns for supporting windings, each adapted on a horizontal axis, reference herein will be with regard to a single phase. As shown, a spatial separation exists between the main coils and the primary LV auxiliary coil. This configuration causes a loose coupling with other windings and a high leakage inductance for the LV primary auxiliary windings. However, the scope of invention is not limited in this aspect and other methods can be applied to generate high leakage inductances for the primary LV auxiliary winding. While the scope of the present invention is not limited in this regard, in a medium voltage implementation in which core 205 is approximately 2 to 10 feet high, this separation may be on the order of between approximately 0.5 and 6 inches to provide the desired high leakage inductance between the primary auxiliary winding 230 and the main secondary windings 220 and main primary winding 210.

As seen, the configuration of the main secondary windings 220 is such that these windings are wrapped concentrically around each other, and further that these windings are also concentrically wrapped around the auxiliary secondary winding 240. Note that in the implementation of FIG. 5, auxiliary secondary winding 240 may extend substantially along the entirety of the column length of core 205 and may have the main secondary windings 220 wrapped there around.

Thus in the particular implementation, the secondary windings 220 may be next concentrically adapted, e.g., in order of a first phase-shifted secondary winding 220a, a second phase-shifted secondary winding 220c, and finally a non-phase shifted secondary winding 220b. Finally, wrapped concentrically around these windings is the main primary winding, MV winding 210. The spacing between coils corresponds to cooling method and isolation and voltage level of the coils. Thus while described above as a forced air cooling technique, this method can be applied to natural cooled, and water cooled transformers. Various transformer manufacturing techniques can be used in realizing the coils and insulation. As examples, different wire types (e.g., round, square, or so forth) and different insulation materials (e.g., NOMEX™ felt or paper insulation, fiber, wood, epoxy, or so forth) can be used.

The configuration shown in FIG. 5 thus provides for loose coupling between the primary auxiliary winding 230 and the main windings 210 and 220 (in particular, main secondary windings 220). However, different winding geometries or methods can be implemented to provide high leakage inductance for the LV auxiliary primary winding.

Note that in FIG. 5, direction from left to right may correspond from a front to a rear of a cabinet in which the transformer is adapted. In this way, a horizontal arrangement is realized such that air flow coming from an input mechanism such as a grill at a front panel of the transformer bay may receive air which is pulled through the grill and across the windings (and core) from a front to a rear portion of the cabinet. Then the air may be forced up through a rear of a cabinet and output via fans or other cooling members that act to pull the air across the transformers and up and out through these exhaust fans. In this way, improved cooling can be realized as a large volume of air that travels in a substantially linear and generally laminar flow can occur, without the need for baffles or other air handling or director equipment. Note that FIG. 5 shows only a single modular transformer and in various implementations three or more such transformers may be present in a transformer bay of a cabinet in accordance with an embodiment of the present invention. When multiple such transformers are present, spacing may be maintained between the transformers such that at least some amount of open space is present between the windings of the two transformers, such that air flow may pass and magnetic and electric isolation is maintained between the transformers.

When using auxiliary windings in accordance with an embodiment of the present invention at power-up of a drive, power is supplied through the high leakage inductance LV auxiliary primary winding(s). The high inductance of this set of windings can slow the rate of capacitor charging and limit the in-rush current to the drive. Furthermore, another auxiliary secondary winding can be embedded into a transformer module for providing power to cooling fans or any other auxiliary power usage. Of course, a given system may not implement any auxiliary windings.

Figure 6:
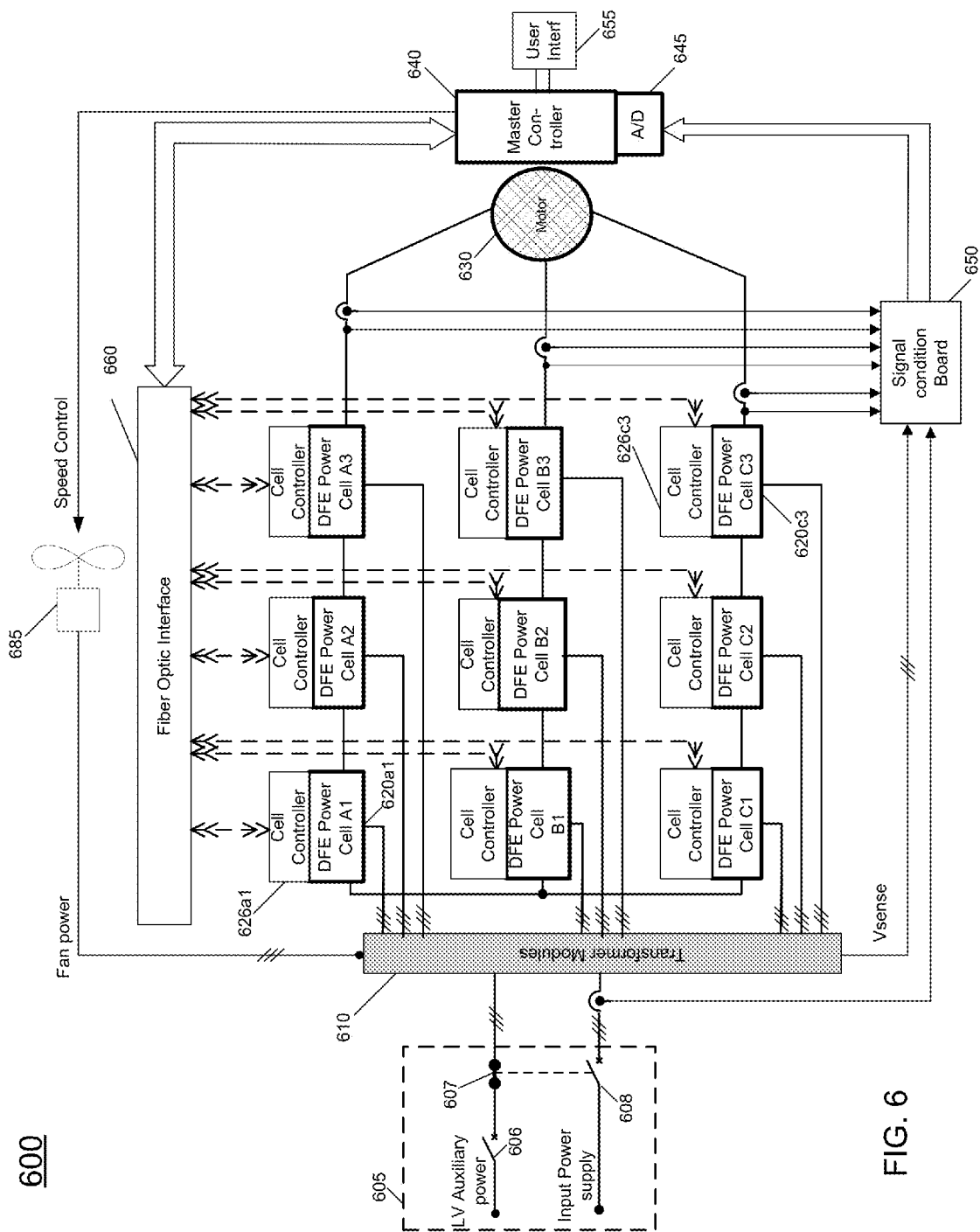
FIG. 6 is a block diagram of a system in accordance with an embodiment of the present invention.

Referring now to FIG. 6, shown is a block diagram of a system in accordance with an embodiment of the present invention. As shown in FIG. 6, system 600 may be a medium-voltage drive. Specifically, in the embodiment of FIG. 6, a three-phase, medium-voltage drive is shown that includes a plurality of power cell chambers $620_{A1}$-$620_{C3}$ (referred to in FIG. 6 as diode front end (DFE) cells). As seen, a local cell controller $626_{A1}$-$626_{C3}$ is associated with each of the power cell chambers. Understand that while shown as a single enclosure, each of the power cell chambers may be separated into a fixed portion and a moveable portion and that the local cell controller may in some embodiments be adapted within an enclosure of the moveable power cell. Also, understand that while not shown in FIG. 6 for ease of illustration a plurality of power service buses may be configured between these different portions of the power cells and furthermore may provide for connections between each power cell and a master controller 640.

As seen, each of these local controllers may communicate with a fiber optic interface 660. In some implementations, a pair of unidirectional fiber optic channels may be coupled between each local controller and fiber optic interface 660. In turn, fiber optic interface 660 communicates with a master controller 640 that further includes an ADC 645.

Master controller 640 may provide control signals to fiber optic interface 660 for transmission to the different local controllers. In one embodiment, these control signals may be voltage reference signals, which cause the local controllers to perform certain processing to generate the needed switching signals. In other implementations, the switching signals themselves may be sent by master controller 640 for transmission to the local cell controllers.

As further seen in FIG. 6, a signal conditioning board 650 may be present to sense or perform signal processing with regard to various information, namely voltage and/or current information obtained both from the input power source and the output of the different phase output lines coupled to a load 630 which in one embodiment may be a motor, as well as from an auxiliary secondary winding in accordance with an embodiment of the present invention.

In addition to the control information described above, additional information from master controller 640 can be provided to the individual local controllers. In addition, the local controllers can provide information such as status information, both as to normal operation as well as faults, over-temperature situations or so forth, back to master controller 640. Master controller 640 may further be associated with a user input device 655 such as a keyboard and/or touch screen display and which may be adapted within a user interface bay to enable user input to control various features such as speed, torque, selection of different power cells to be enabled and so forth, as well as to provide status information to the user via a given display or other output means.

As shown in FIG. 6, input power to transformer modules 610 may include both a medium voltage source, e.g., from an input power supply such as a utility connection, and a low voltage power source, e.g., from an auxiliary low voltage power source, as discussed above. Such sources may be provided to a customer cabinet 605, which may be at a separate location from a cabinet of drive system 600. Cabinet 605 may include a control circuit to switch between powering of the drive by either the main power source or the auxiliary power source. For example, at power-up, a switch 606, which may be a circuit breaker, of the low voltage auxiliary power line is closed such that power is provided to transformer module 610 through a normally closed contact 607 to enable pre-charging of the capacitors of the different power cells 620 via this low voltage source. Accordingly, the capacitors of power cells 620 are charged through LV auxiliary primary winding(s) of transformer module 610 to a predetermined voltage level. Then after passing of a predetermined time, which may be on the order of approximately 50 to 10000 milliseconds (ms), a main power supply power switch 608 (e.g., a MV circuit breaker) is closed. Normally closed contact 607 can be used to disconnect the LV auxiliary power. By closing the main power supply, the capacitors are thus charged to their rated voltage. A timer or programmable logic controller (PLC) or other type of control circuit can be used to control the process and sequence of switching. In another embodiment, the master controller can determine this charging time by monitoring the DC-bus voltage of one or more power cells. After the capacitors of power cells are charged to a predetermined level, the master controller can send an activation signal to MV circuit breaker 608. However in either implementation method, the sequence of switching for powering-up the drive is first to close the LV auxiliary switch 606 (i.e. circuit breaker). After a predetermined time or receiving a command from a controller, the LV switch 608 is opened and main power switch 608 (i.e., MV circuit breaker) is closed. Note in other implementations, direct connection form utility to drive system 600 may occur (i.e., without customer cabinet 605).

Referring now to FIG. 7A, shown is an illustration of a cabinet in accordance with one embodiment of the present invention. As shown as FIG. 7A, a cabinet that houses a drive system, e.g., a medium voltage drive system, includes a transformer bay 20, a power cell bay 30, a fan bay 40, and a cabinet controller bay 50.

The illustration of FIG. 7A further shows the horizontal configuration of three transformers $200_a$-$200_c$, each of which includes a core having three columns, one for each of three phases, each having a horizontally aligned axis around which primary and secondary coils may be concentrically wrapped. Also seen are the illustrations of individual power cell chambers $32_a$, which show the moveable portions that are formed of an enclosure with heat sinks adapted on top and bottom portions. As described above, in some embodiments, each chamber 32 may be located on top of spacers to provide simple and low cost mechanical support and greater air flow.

Referring now to FIG. 7B, shown is a side view of the cabinet that illustrates air flow for cooling in accordance with an embodiment of the present invention. As seen in FIG. 7B, a grill or other input mechanism 25 may be provided at a forward panel of transformer bay 20 to enable incoming air flow. As seen, the incoming air flow passes horizontally through transformers 200, as well as passing vertically up to the power cell bay. The laminar air flow through transformers 200 may then be vertically removed through an air duct at a rear of the cabinet by fans within fan bay 40.

FIG. 7B further shows the configuration of the power cell chambers which are formed from the moveable enclosure 110, power service bus 120 and capacitor of the fixed portion 115 (note that other components may be present in the fixed portion as discussed above, e.g., with reference to FIG. 2A). As seen in FIG. 7B, the air flow through the power cell bay may further be provided vertically upward via fans within fan bay 40. While shown with this particular implementation in the embodiment of FIGS. 7A and 7B, the scope of the present invention is not limited in this regard.

As described above, a modular power control system includes building blocks that can be used to configure systems having one or more cabinets. A modular system may include one or more cabinets, each of which may be configured such as described above with regard to FIG. 1. Still further, a master control cabinet per system may be provided to enable centralized control for the overall system. Thus in various embodiments, a power control system may include a master control cabinet and one more or more cell cabinets that can be identically configured. The number and interconnect configuration of the cell cabinets determine the current and voltage capacity of the overall system. In different implementations, the cabinets can be configured in parallel for greater current and/or in series for greater voltage applications.

The control and diagnostics for the modular system can also be distributed among the major components. The master controller provides control information to each cell cabinet. Each cell cabinet provides local control of the power cells, via a cabinet controller. Status information is provided from the power cells to each cabinet controller. The cabinet controller then provides cabinet status back to the master controller. In various embodiments, diagnostics are run locally for each major component. Each power cell controller, cell controller, and master controller initiates local operations to assess operational readiness. Cell cabinet operational readiness is then communicated back to the master controller, and the master controller then determines the overall readiness of the system.

Figure 8A:
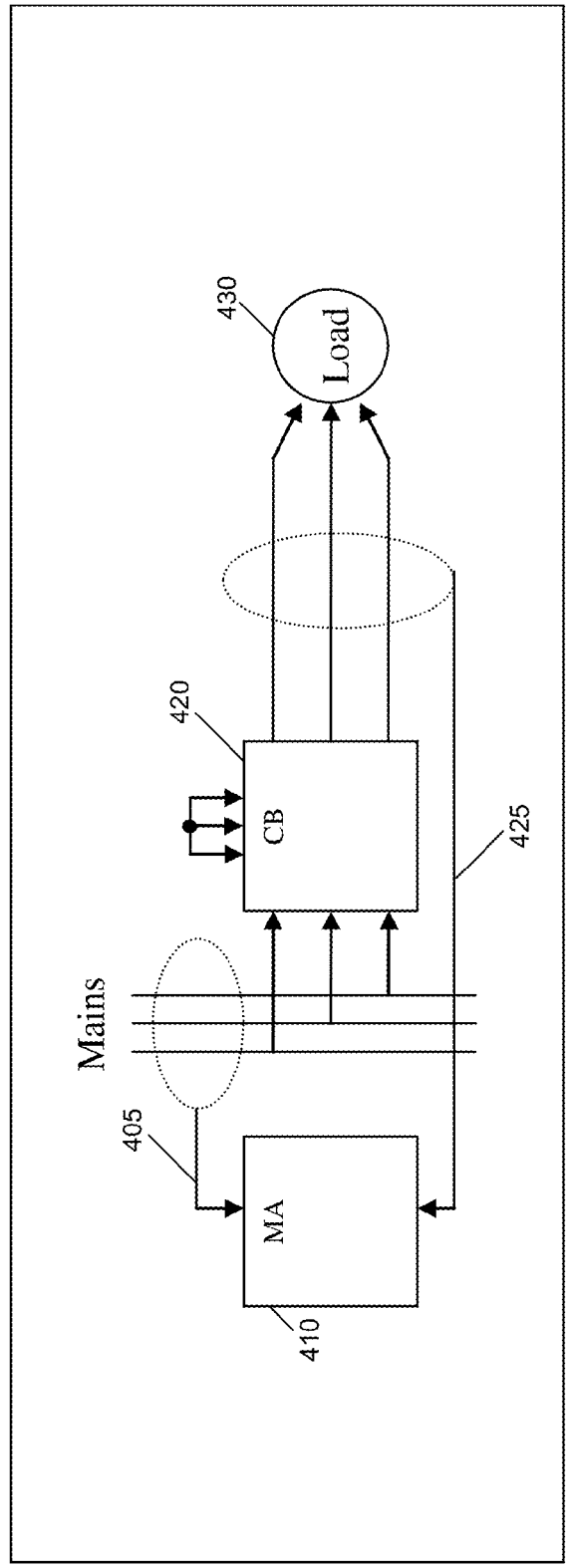
FIG. 8A is a block diagram of a modular system configuration in accordance with one embodiment of the present invention.

Referring now to FIG. 8A, shown is a block diagram of a modular system configuration in accordance with one embodiment of the present invention. As shown in FIG. 8A, system 400 may be a minimal modular system, e.g., for a relatively low medium voltage application in which only a single power cell cabinet 420 is present and which in turn is coupled to a load 430. As seen, cabinet 420 is coupled to receive input power from, e.g., a set of AC mains. Feedback information, namely the input current and voltage may be provided via a feedback path 405 to a master control cabinet 410, which may further receive a feedback regarding the output voltage and current from power cell cabinet 420.

Figure 8B:
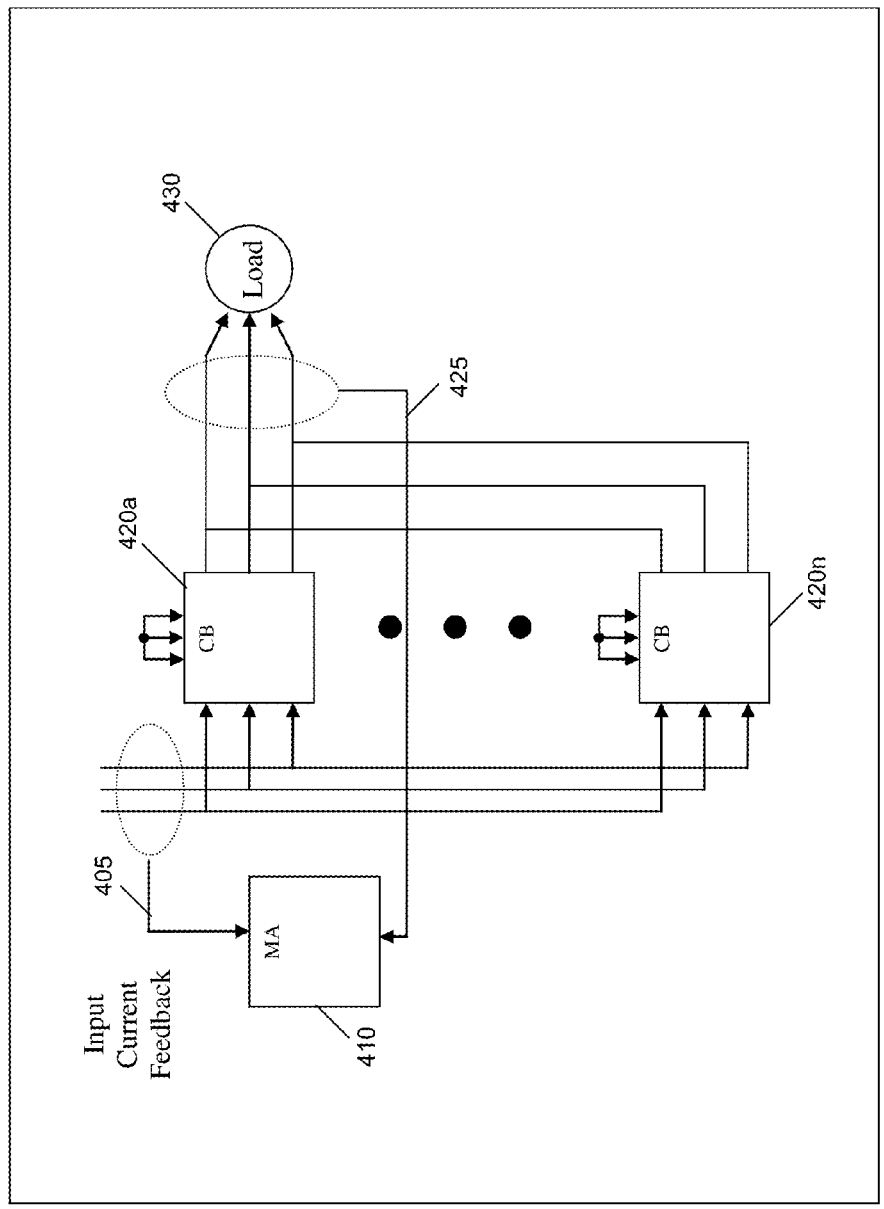
FIG. 8B is a block diagram of a parallel modular system configuration in accordance with an embodiment of the present invention.

In other implementations, a different configuration may be realized. Referring now to FIG. 8B, shown is a block diagram of a parallel modular system configuration in accordance with an embodiment of the present invention. As shown in FIG. 8B, system 400' includes a plurality of power cell cabinets $420_a$-$420_n$ coupled in parallel to increase drive output current capability. Each power cell cabinet is paralleled to the AC mains and provides output current to load 430. The master control 410 maintains load sharing among cabinets $420_a$-$420_n$ by processing current feedbacks via 405 and 425.

Figure 8C:
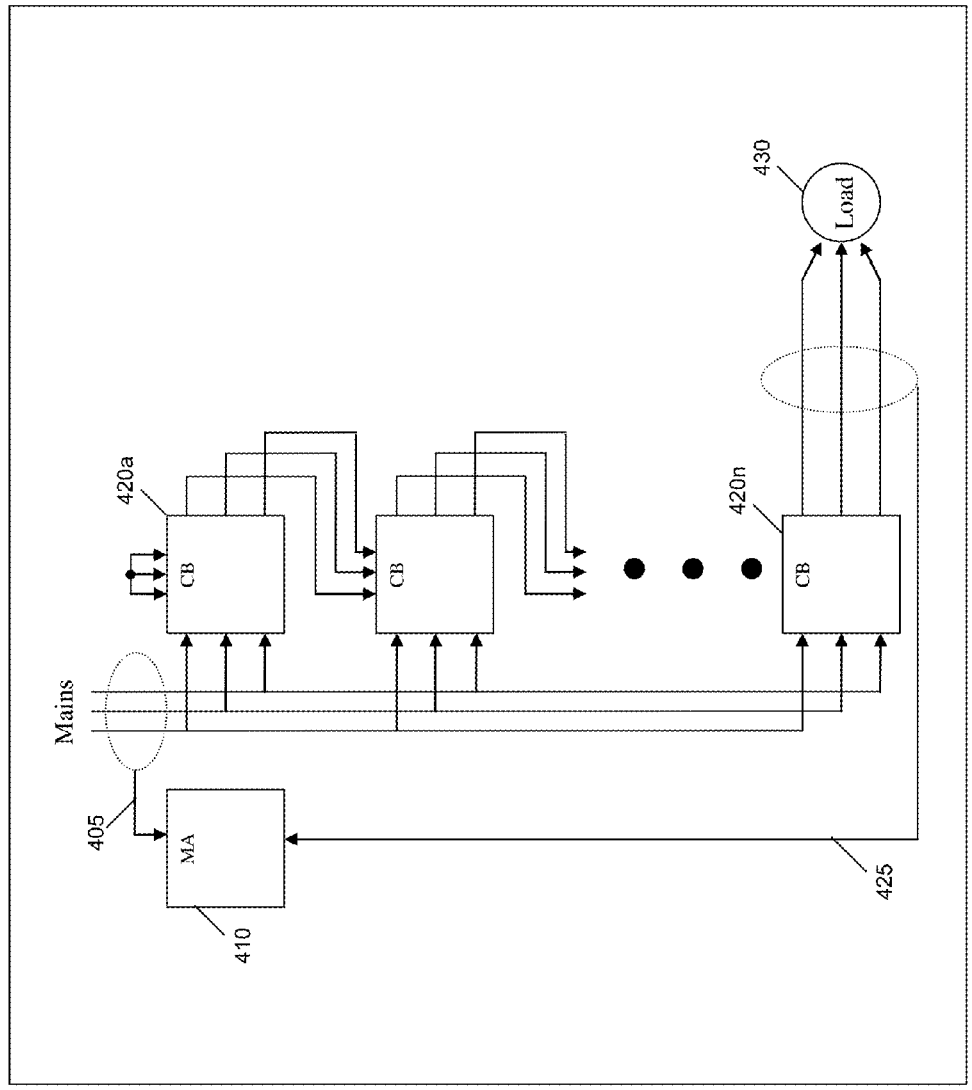
FIG. 8C is a block diagram of a series modular system configuration in accordance with one embodiment of the present invention.

In yet other implementations a series configuration is possible. Referring now to FIG. 8C, shown is a block diagram of a series configuration. As seen in FIG. 8C, system 400" includes a plurality of power cell cabinets $420_a$-$420_n$ coupled in series, such that the outputs are cascaded to provide a wide range output voltage capability to load 430. Similar feedback connections to master cabinet control 410 are provided to preserve load voltage sharing among the power cell cabinets. Other implementations may use combinations of parallel and serial configurations to increase load voltage and current capability.

Figure 9A:
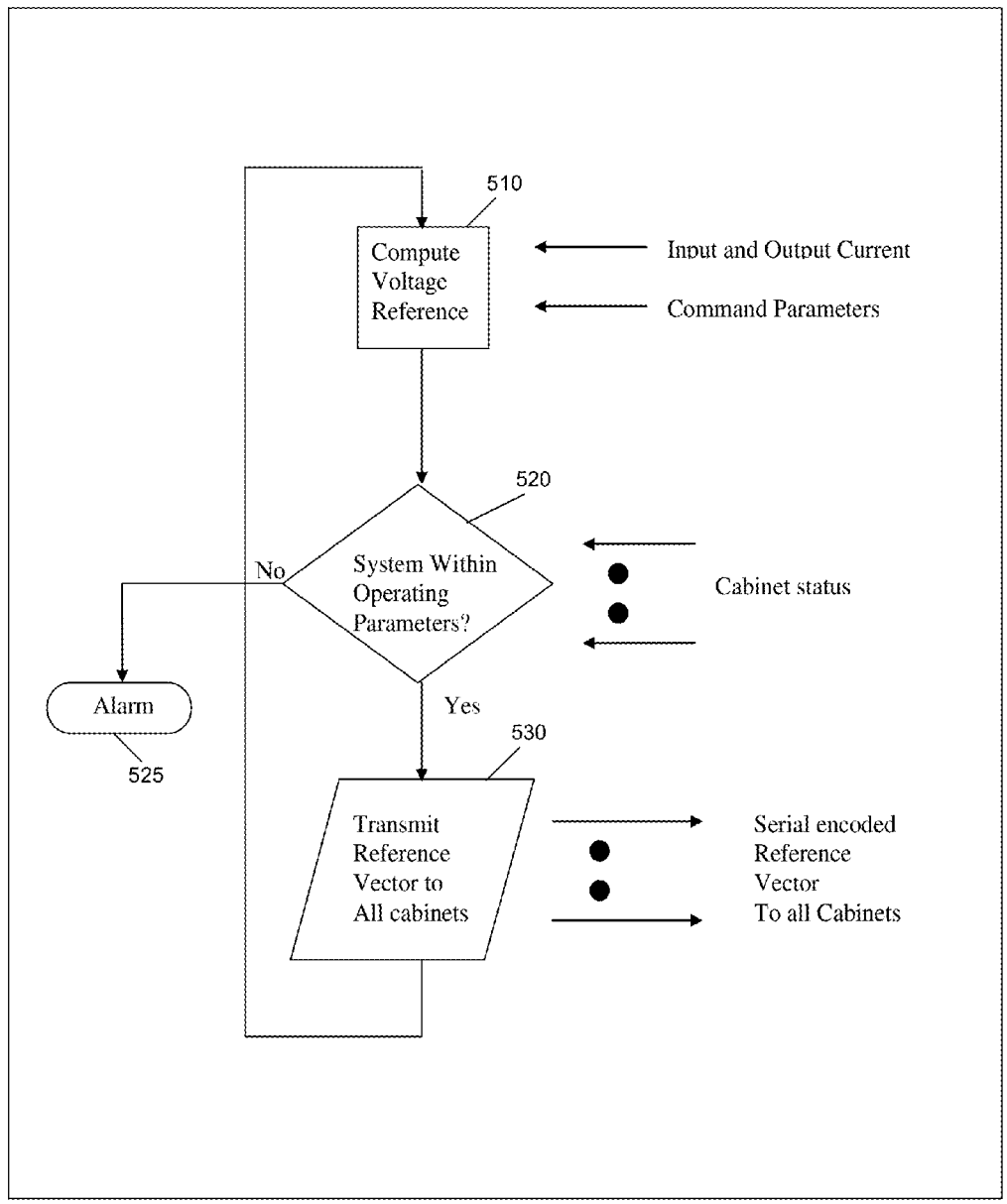
FIG. 9A is a flow diagram for a basic control loop for a master controller in accordance with one embodiment of the present invention.

Referring to FIG. 9A, shown is a flow diagram of a basic control loop for a master controller in accordance with one embodiment of the present invention. As shown in FIG. 9A, method 500 may be performed on a continual basis by the master controller. Specifically, based on input current and output voltage and current information received in the master controller, and various command parameters, including current and voltage ratings, speed, frequency, torque and so forth, a voltage reference may be computed (block 510). In one embodiment, the voltage or current reference may be computed using a standard motor vector control algorithm, e.g., processing torque and flux commands, and rotor position. Next, it may be determined based on various information coming from the different cabinets whether the system is operating within its operating parameters (diamond 520). If not, an alarm may be triggered (block 525) followed by a master control action if required. Otherwise, normal operation may continue and a reference vector may be transmitted to all cabinets (block 530). In one embodiment, this reference vector may be serially encoded and sent to the cabinets, e.g., via a fiber optic interface.

Figure 9B:
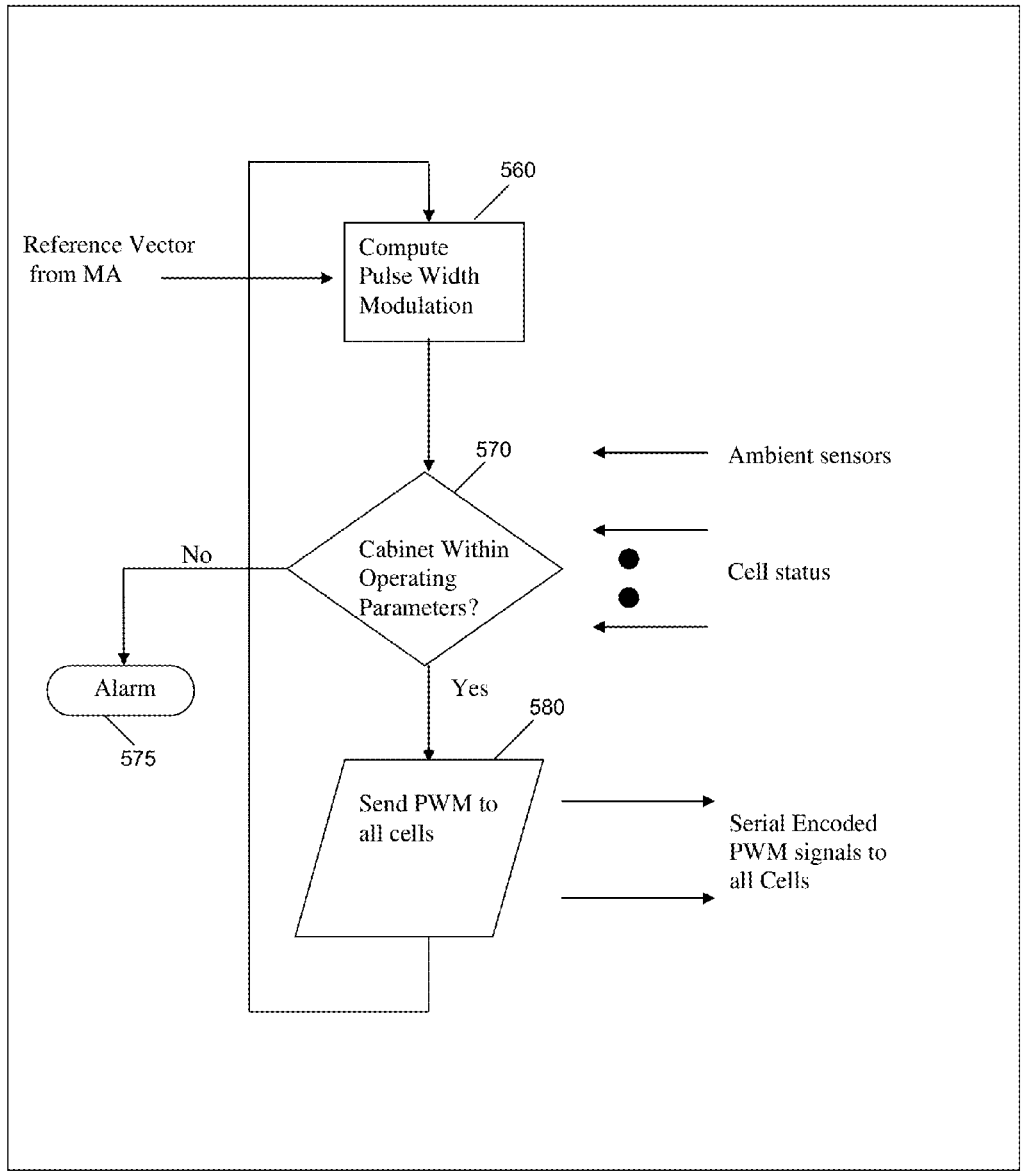
FIG. 9B is a flow diagram for a basic control loop for a cabinet in accordance with one embodiment of the present invention.

Referring now to FIG. 9B, shown is a flow diagram for a basic control loop for a cabinet in accordance with one embodiment of the present invention. As seen in FIG. 9B, method 550 may begin by receiving the reference vector from the master controller in a cabinet controller. From this reference vector, a switching pattern using a carried based pulse width modulation scheme or any other modulation technique for the cells within the cabinet may be computed (block 560). In one embodiment, this PWM calculation may be in accordance with commands received from the master controller and general drive operation status. Then based on various status information, including information from ambient sensors and the various power cells, it may be determined whether the cabinet is operating within its operating parameters (diamond 570). If not, an alarm may be triggered (block 575). Otherwise, normal operation may continue and the PWM signals may be sent to the power cells of the cabinet (block 580). In one embodiment, the PWM signals may be serially encoded and sent to the cells, e.g., via a fiber optic interface.

Figure 9C:
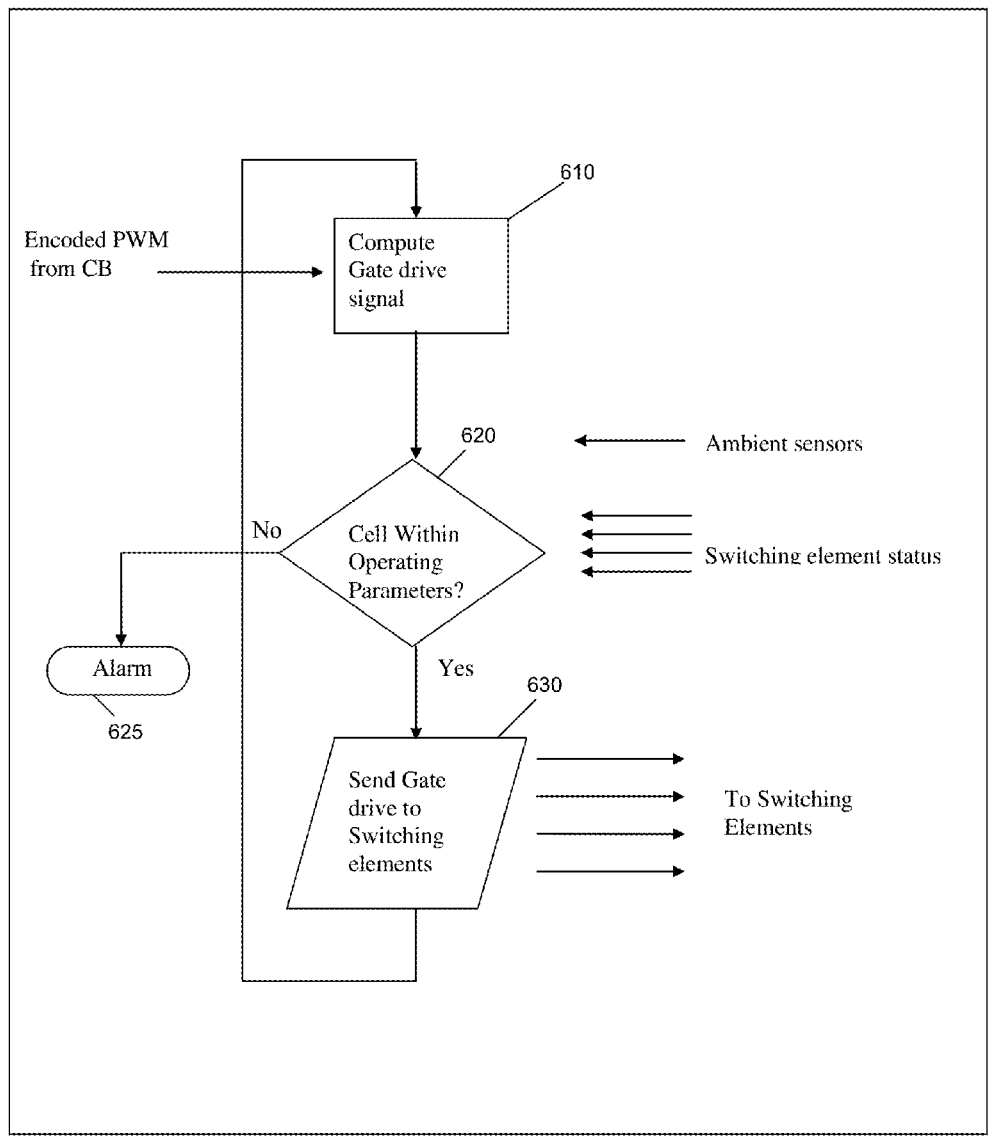
FIG. 9C is a flow diagram for a method for performing control of a power cell in accordance with one embodiment of the present invention.

Referring now to FIG. 9C, shown is a flow diagram of a method for performing control of a power cell via a local controller of the power cell in accordance with one embodiment of the present invention. As shown in FIG. 9C, method 600 may begin by each local controller receiving encoded PWM signals from the cabinet controller of the cabinet. From this information gate drive signals may be computed (block 610). In one embodiment, these signals may be computed by a local FPGA within the moveable cell section, and that these computations are based on cell status and PWM command signals received from the cabinet controller. Then, based on various information including ambient sensors and the status of the switching elements themselves, it may be determined whether the cell is operating within its operating parameters (diamond 620). If not, an alarm may be triggered (block 625). Otherwise, normal operation may continue and gate drive signals may be sent to the switching elements (block 630). While shown with this particular control implementation in the embodiment of FIGS. 9A-9C, the scope of the present invention is not limited in this regard. Furthermore, understand that the various control operations described may be performed in different orders and may be performed in different controllers such that the different control can be handled at a more local or global basis depending on a desired implementation.

Figure 10A:
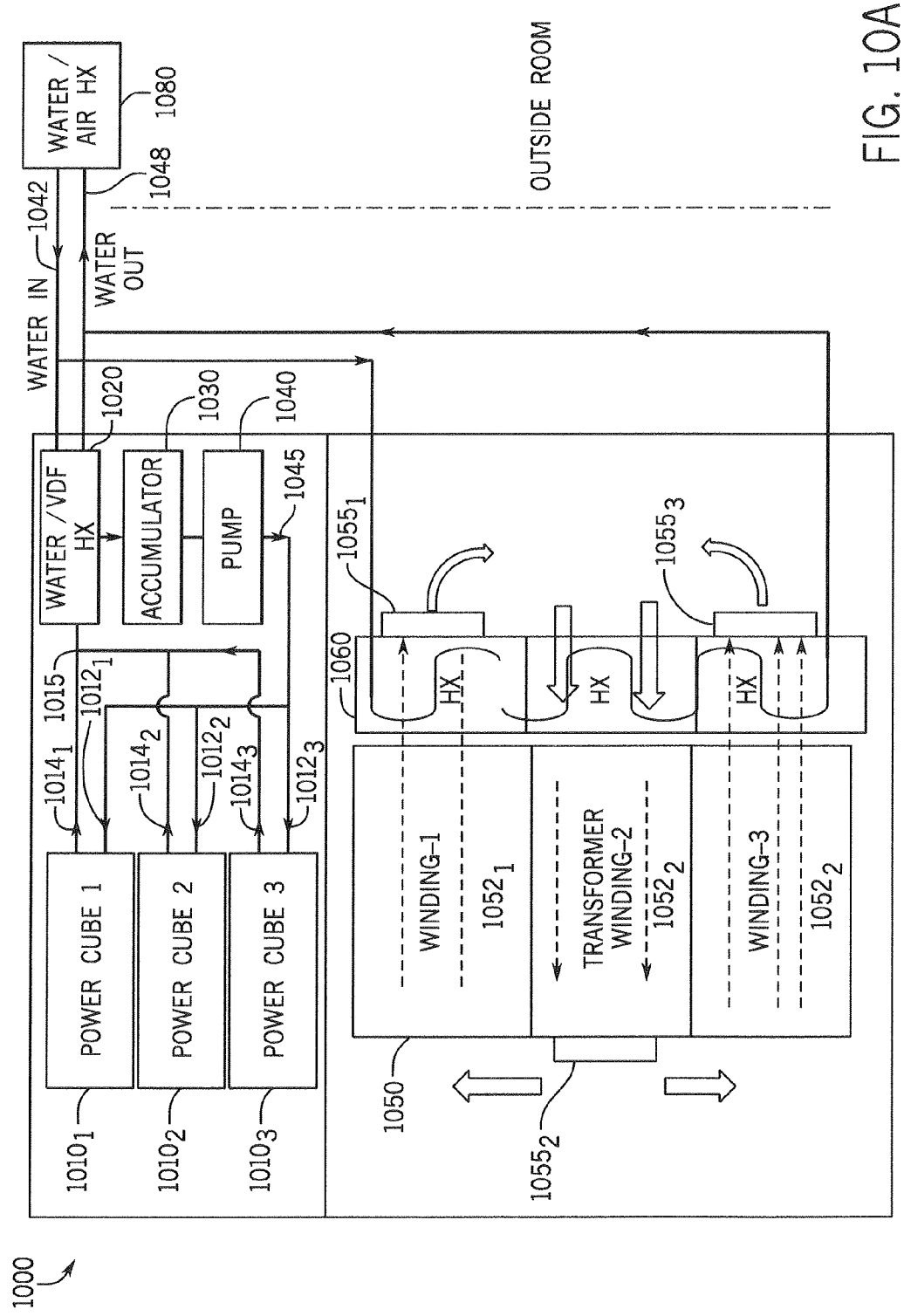
FIG. 10A is a block diagram of a single slice of a drive system that can be cooled in accordance with an embodiment of the present invention.

Referring now to FIG. 10A, shown is a block diagram of a single slice of a drive system 1000 that can be cooled in accordance with an embodiment of the present invention. In FIG. 10A, the portion of drive system 1000 shown may be a single slice (also referred to herein as slice 1000) that includes a plurality of power cells or cubes $1010_1$-$1010_3$ (generically power cube 1010). Each of these power cubes can be configured as described above, e.g., with regard to FIGS. 2A-2D, with each cell configured within a given chamber and including a movable portion and a fixed portion. Or a unitary power cube design in which the entire power cube is movable may instead be provided. However, understand the scope of the present invention is not limited in this regard. For example, in other embodiments rack mounted power cubes can be provided that can be plugged into a backplane or other supporting mechanism within a cabinet. In any event, the cubes may be inserted in corresponding chambers of an electronics or power cube bay of a cabinet. Given the cooling capabilities of a cooling system in accordance with an embodiment of the present invention, this cabinet may be an enclosed NEMA-4 cabinet, improving reliability and reducing heat transfer with an ambient environment.

Note that the illustration shown in FIG. 10A is at a high level to show the components involved in a cooling system for a single slice. In various embodiments, the cooling system may be a fully enclosed liquid cooling system. Specifically, each power cube 1010 may include one or more cold plates or other heat transfer members that acts as an evaporator to receive a flow of cool fluid to thus remove heat from components within the power cube and provide combined fluid and vapor phases to a remainder of the cooling system.

In the embodiment shown, the cooling system can include a heat exchanger 1080 which in an embodiment may be an air-based heat exchanger such as a condenser that cools the heated high pressure vapor and fluid with an ambient air source that may be directed via a fan. Note that according to various embodiments, heat exchanger 1080 is located externally to drive system 1000. And more specifically, owing to the advantages of the totally enclosed liquid cooling system, this heat exchanger may be located externally from a building or other enclosure in which the module is located. As such, a heat exchange with the ambient environment is avoided to not increase the temperature of the enclosed space. As such, the need for additional HVAC or other cooling of a building or other enclosure including a drive system as described herein can be avoided.

In other embodiments, this heat exchanger can be a water-based heat exchanger or another fluid-based heat exchanger. Note that this heat exchanger can handle any type of fluid such as fresh/sea water, oil, ethylene glycol mixture, any other dielectric fluid, etc., and operates by directly or indirectly cooling the heated vapor and fluid to thus reduce its temperature and pressure and provide a flow of liquid coolant. Heat exchanger 1080 may be a water or any secondary fluid-to-air based exchanger. The secondary fluid is cooled by air and fans on heat exchanger 1080. The cooled secondary fluid returns to an internal water/VDF heat exchanger 1020 via an inlet conduit 1042 to cool the primary fluid (e.g., R134a) coming from an outlet conduit 1015 (note the terms inlet and outlet may be with respect to the power cubes).

In an embodiment, inlet conduit 1042, which can be a combination of a dielectric hose section such as thermoplastic hoses, copper or other tubing or so forth, or of another type of conduit, provides communication of coolant from heat exchanger 1080. There is at least one section of dielectric part from the power cubes to the inlet and outlet manifold or conduits to isolate the floating voltages between the power cubes of a low/medium/high voltage drive system. A cooling system in accordance with an embodiment of the present invention can isolate up to or more than 13.8 kV isolation.

Still referring to FIG. 10, internal heat exchanger 1020 couples to an accumulator/two phase fluid separator 1030 (hereafter accumulator) that in turn is coupled to a pump 1040 which may be a low pressure pump that provides a regulated flow of liquid coolant via an inlet conduit 1045 to each of the power cubes so that each of the power cubes receives a regulated flow of liquid coolant. Note that in the embodiment shown, each power cube 1010 may include a single inlet port 1012$_1$-1012$_3$, which as will be described further below may be provided with quick disconnect fitting to enable rapid and independent connection/disconnection of a given power cube to/from the cooling system such that a given power cube can be dynamically inserted/removed during normal system operation without an effect on the remainder of the system. Still further, in some embodiments, these ports may be received via blind mating connections to enable easy manual insertion and disconnection. By using dielectric hoses, electrical isolation (e.g., up to 35 kV) between hose-to-hose (i.e., line-to-line) can be realized, and also between power cube to manifold, which is grounded (i.e., line to neutral). This in turn helps to maintain isolation between adjacent power cubes.

After cooling the components within a given power cube, the heated vapor and liquid may exit via a corresponding outlet port 1014$_1$-1014$_3$ (also realized via quick disconnect and/or blind mating connection, in some embodiments). Each port couples to an outlet conduit 1015, which again may be formed of a combination of dielectric section such as thermoplastic hoses, copper or other tubing or so forth, and may be coupled to internal heat exchanger 1020. In certain embodiments, a manifold assembly may be present to support routing of the conduits and enable connection of ports 1012 and 1014 to corresponding ports or other connection members adapted within this manifold assembly and coupled to conduit 1015. However, this manifold assembly is not illustrated in FIG. 10A so as to not obscure other details shown. Note that most joints can be brazed, which improves reliability of the cooling system and shock tolerance. In an embodiment a number of disconnects are used: between cold plates of the power cubes and manifold assembly; between a power cube and thermoplastic hose; blind mate connections; and quick disconnect at the pump tray and the termination of the inlet/outlet conduits.

As further shown in FIG. 10A, a modular transformer 1050 may be present and coupled to the power cubes. In various embodiments, this modular transformer may be configured as discussed above. As seen in FIG. 10A, transformer 1050 is cooled via a heat exchanger 1060 located adjacent to the transformer. To enable flow of air across the windings of the transformer (namely windings 1052$_1$-1052$_3$), a plurality of fans 1055$_1$-1055$_3$ may be adapted about the heat exchanger and transformer. In the specific embodiment shown in FIG. 10A, a first fan 1055$_1$ couples adjacent to a non-transformer side of heat exchanger 1060 to cause a flow that pushes air in a downward and rotational direction to be passed through heat exchanger 1060 and through transformer winding 1052$_2$, from which air is pulled from via a second fan 1055$_2$ that similarly causes air to flow in exhaust directions towards both of windings 1052$_1$ and 1052$_3$. Note further the presence of an additional fan 1055$_3$ that causes air to be pulled through winding 1052$_3$ and heat exchanger 1060 back towards the input path of heat exchanger 1060 substantially located adjacent winding 1052$_2$. In an embodiment, each of the fans may be configured as a centrifugal and/or axial fan. Of course other fan implementations are possible.

In an embodiment, the fan motors may be controlled responsive to a load of a variable frequency drive (VFD). In this way the fan speed can be maintained proportionally to air flow rate and likewise to the transformer winding temperature. Also, by using VFD in combination with a separate fan for each winding, the temperature of each winding can be controlled separately, allowing greater control on winding performance. Although shown at this high level in the embodiment of FIG. 10A, understand the scope of the present invention is not limited in this regard.

As examples of the cooling realized for the transformer portion of a slice, a change in temperature ($\Delta T$) across first and third windings 1052$_1$ and 1052$_3$ may be approximately 10° Celsius (C.). In turn, with the flow of cooler air across transformer winding 1052$_2$, a change in temperature of approximately 5° C. may occur. In general, a $\Delta T$ across the windings may be approximately 20° C. when operating at 720 kVA. With a typical winding temperature of 70°, this leads to a winding temperature of between approximately 90° C.-100° C. Furthermore, owing to the fully enclosed NEMA-4 design of the cabinet, this temperature may be realized in an enclosed environment in which very little thermal energy escapes to the ambient environment, enabling location of a drive system in a building or other enclosure with reduced HVAC requirements.

Figure 10B:
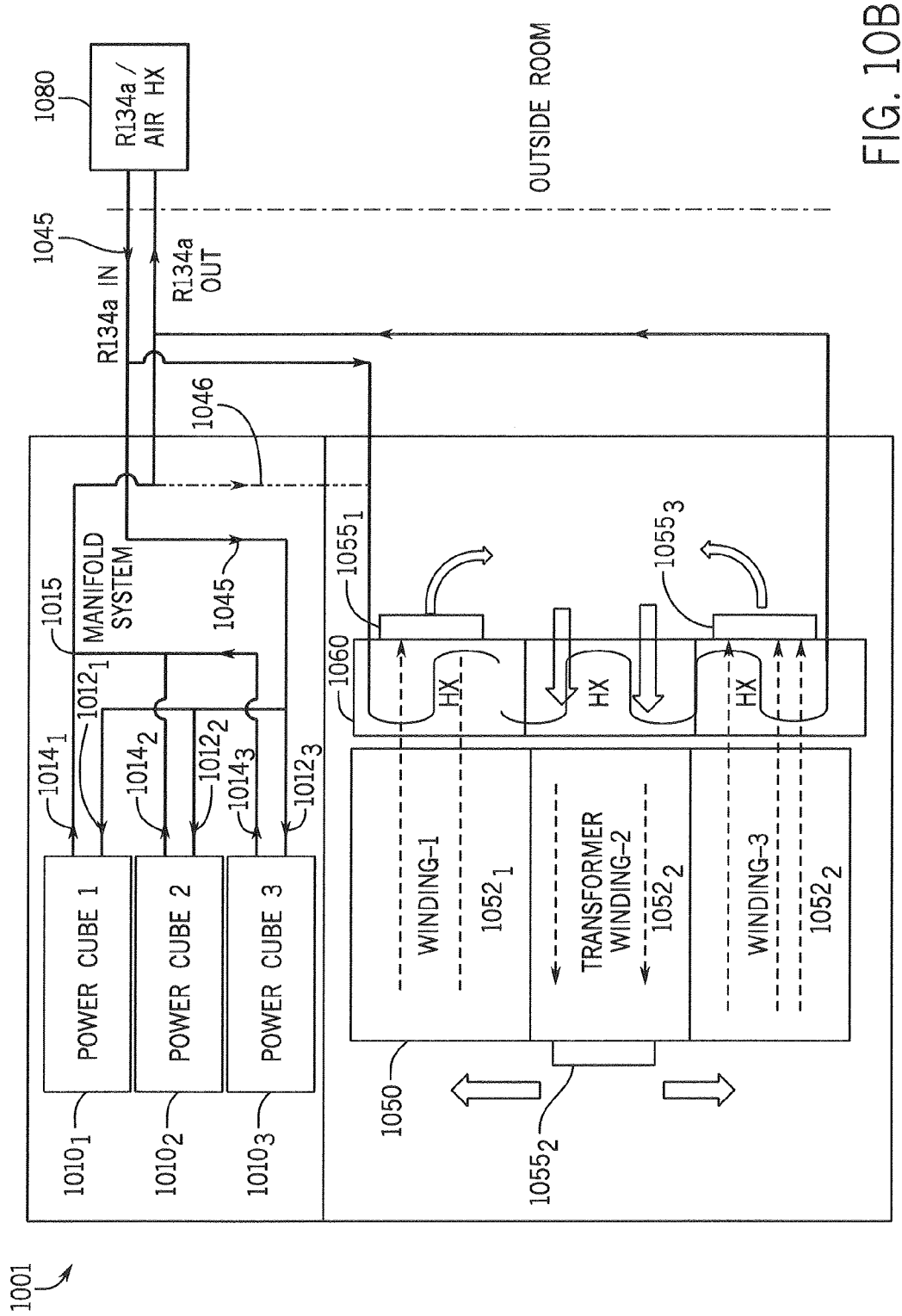
FIG. 10B is a block diagram of a single slice of a drive system that can be cooled in accordance with an embodiment of the present invention

In another embodiment, a totally enclosed cooling system for a drive system may be similarly adapted as described in FIG. 10A. However, as seen in the embodiment of FIG. 10B, shown is another example of a totally enclosed cooling system for a drive system. In this implementation, the internal heat exchanger associated with the power cubes, the accumulator and the pump are avoided, and a manifold system may couple directly to the power cubes of the electronics portion of the cabinet. In turn, connection of dielectric liquid coolant with the transformer portion may occur via separate conduits of the input and output lines directly to the heat exchanger for the transformer section. Alternately a supplemental path for the inlet conduit to heat exchanger 1060 may be via the manifold system with an additional optional path 1046 that couples to heat exchanger 1060.

Figure 11:
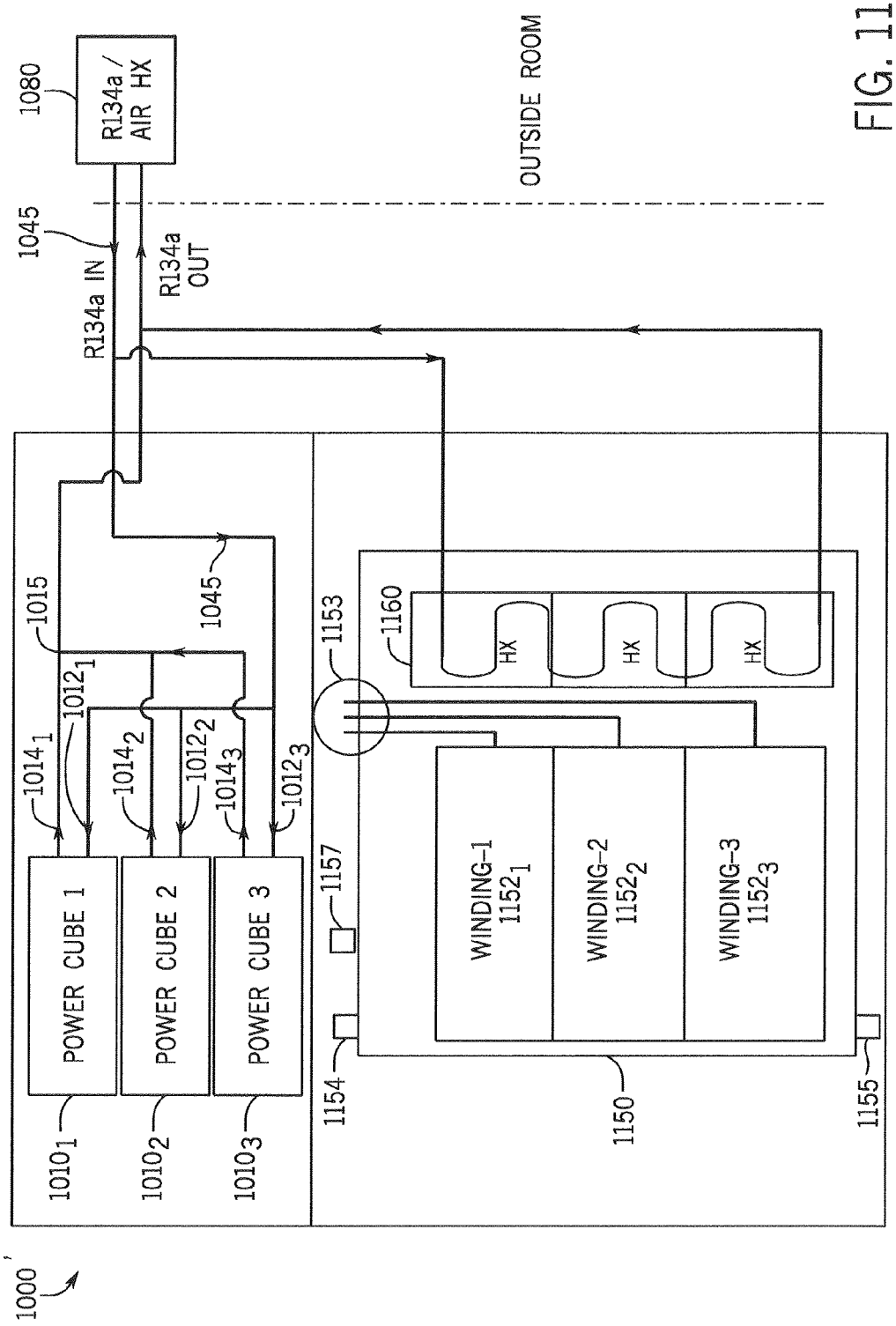
FIG. 11 is a block diagram of a single slice of a drive system that can be cooled in accordance with another embodiment of the present invention.

Referring now to FIG. 11, a different type of transformer, namely an insulating oil filled transformer is present, leading to a different configuration of the cooling system, at least with regard to the transformer portion of the slice. As seen in FIG. 11, a portion of a system 1000', which again is a slice of the drive system, may be similarly configured as for the FIG. 10B embodiment, at least with regard to the electronics of the power cube portions of the upper manifold assembly. However, here transformer 1150 is configured as an oil-filled transformer. This oil, which may be of various types such as a 3M engineered fluid, e.g., a 3M brand NOVEC 649, NOVEC 7100, or a mineral oil, acts as an insulating oil. In this way, windings $1152_1$-$1152_3$ may be located in closer proximity to each other, affording the ability to provide the same output power with smaller size windings and in a smaller space. This also provides the ability to increase the voltage rating of the transformer.

Also note in FIG. 11 that a heat exchanger 1160 is located internally to the transformer enclosure 1150. Furthermore, as it is an oil-filled enclosure, the need for fans is avoided. To enable field delivery of oil for the oil-filled transformer, the transformer is configured with a variety of ports including a filling port 1154, a drain port 1155, and a vacuum port 1157. Thus in the field, with drain port 1155 closed and filling port 1154 opened, the enclosure can be filled with oil. Note that a vacuum is pulled before or after filling the fluid via a vacuum port 1157. Also seen in FIG. 11 is a set of electrical connections 1153 which may be implemented via a port assembly on an exterior of the transformer enclosure to enable coupling of the transformer windings to the various power cubes such as described above. Although shown at this high level in the embodiment of FIG. 11, understand the scope of the present invention is not limited in this regard.

Figure 12:
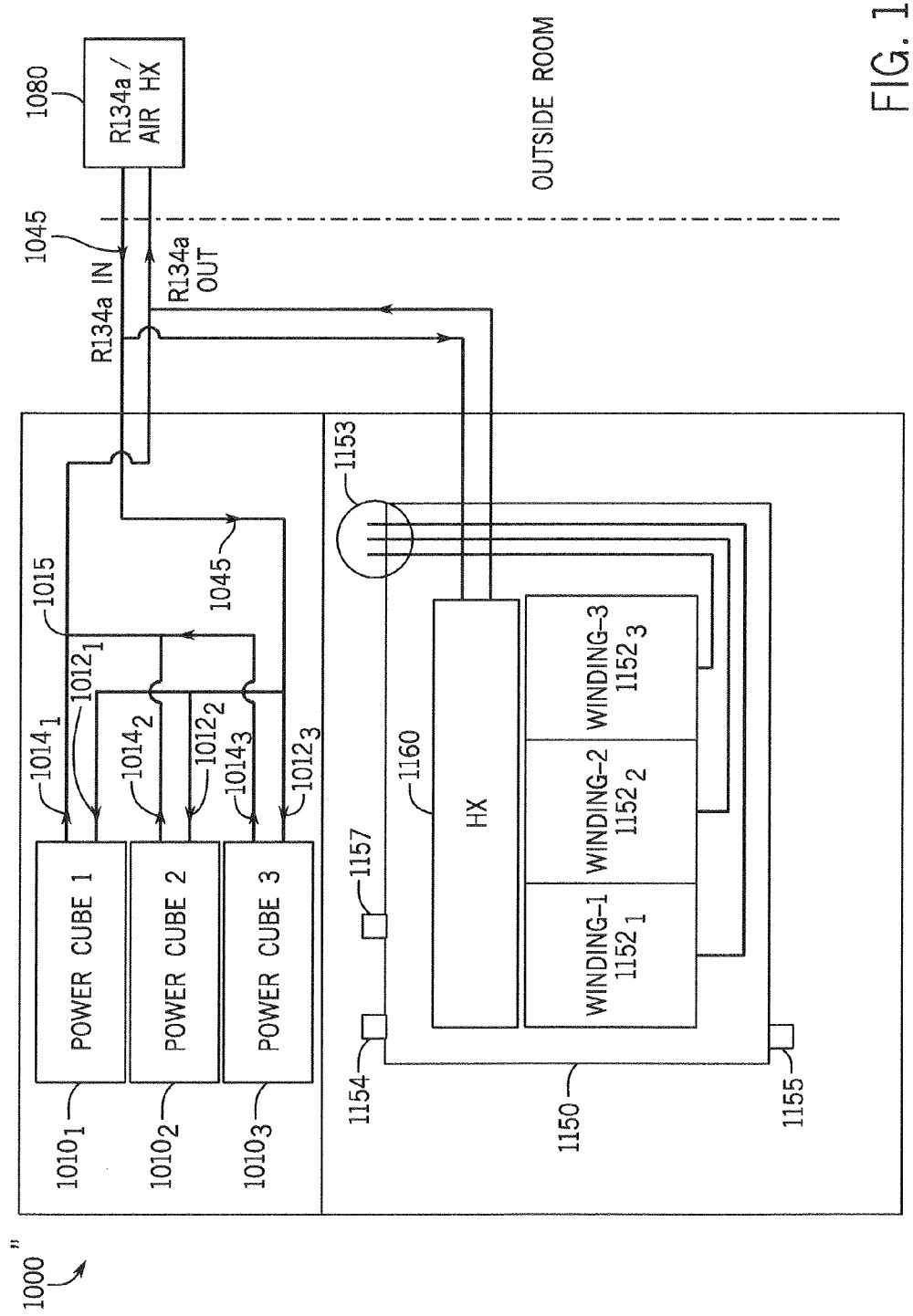
FIG. 12 is another example of a drive system having a cooling arrangement in accordance with an embodiment of the present invention.

Referring to FIG. 12, shown is a portion of a system 1000", which is a slice of a drive system similarly configured to the systems of FIGS. 10B and 11. However here note that oil-filled transformer 1150 is configured in a vertical arrangement with heat exchanger 1160 located adjacent to a top portion of the transformer. In other aspects, system 1000" may operate similar to those discussed above. Furthermore, while not shown for ease of illustration in some embodiments, fans may be adapted adjacent to a top portion of heat exchanger 1160 and/or a bottom portion of transformer 1150. The remaining aspects of system 1000" generally track those described above as to FIGS. 10B and 11.

Of course understand embodiments are not limited to the above-illustrated systems. Various dynamic cooling combinations can be implemented depending on customer desires or system requirements. For example, different types of external heat exchangers may be present in different implementations. Such external heat exchangers may vary from relatively small heat exchangers adapted outside of a cabinet but within a building enclosure to relatively larger heat exchangers located externally to a building enclosure to thus reduce HVAC load. In different implementations, these external heat exchangers may be water-air-based heat exchangers, R134A-air-based heat exchangers or some other type of refrigerant/air exchangers. Furthermore, different ratings from approximately 15 kW-50 kW can be used.

Also in different implementations, an electronics portion of a cabinet may include its own internal heat exchanger, or in other implementations the need for such internal heat exchanger can be avoided. Accordingly, in different implementations an internal heat exchanger may be a R134a-water exchanger with or without pump assemblies. Or the need for such internal heat exchanger can be avoided and a refrigerant such as R134a may be communicated with or without a pump assembly through the power electronics for cooling with the external heat exchanger.

Also as to a transformer portion of a cabinet, it too may include may include its own heat exchanger which may be located within the transformer bay or internally to a transformer enclosure in cases of an oil-filled transformer. Furthermore, understand that different cooling options, including forced air cooling or an NEMA-4 enclosed cooling technique can be realized for the transformer portion. As examples, an air-water heater exchanger may be present in implementations provided with a fan outlet. Instead in an enclosed transformer portion, an air-R134a heat exchanger may be provided.

Embodiments may use the heat of vaporization (flow boiling). This VDF-based cooling is isothermal, and can be plumbed in a serial manner to different cold plates in the power cubes, such that all cold plates in that power cube may be maintained close to the same temperature. Each power cube is floating in terms of voltage with respect to others. When fluid passes from manifold to power cube or vice versa, at least one dielectric section of hoses or conduit is provided. All power cubes then can be connected in series or parallel. Evaporative heat transfer in accordance with an embodiment of the present invention can be 2×-4× better than single-phase (e.g., water) convective heat transfer coefficients. In this way, smaller pumps can be used to lower flow rates, which may be of 20% or less flow rate than a single phase system.

In different embodiments, any vaporizable dielectric can be used. As examples, R134a or low pressure refrigerants can be used, which flash to gas at ambient pressures. These various refrigerants are dielectric and will not harm the electronics in case of leakage occurs, and further cause no corrosion or scaling. Note that the dielectric fluid can be interchanged according to the site location and its respective local environmental codes.

In a VDF system, a liquid-to-gas phase change of a refrigerant such as R134-a occurs within the evaporator such as a cold plate. As long as there is fluid in the cold plate, the cold plate surface will be held close to the boiling point of the fluid. In an example embodiment, for 40° C. refrigerant, 151 J are required to convert 1 g of refrigerant from liquid to gas. Therefore, to dissipate 1 kW of power, a flow rate of 0.43 lit/min is required, in contrast to much higher flow rates for a water-based system. Lower flow rates for a VDF system equate to a smaller pump, power supply, reservoir, and smaller tube diameters for cooling system conduits. And by using lower flow rates of fluid, the parasitic load on the cooling system is reduced, thus improving efficiency of a medium voltage drive system. Also the overall size and weight of the drive system is reduced as compared to water or air cooled systems.

Using a dielectric fluid that vaporizes easily at ambient pressures, many positive attributes adhere including safety, operating temperatures, heat of vaporization for optimum performance, minimum volumes, lubrication and component reliability, and materials compatibility. Dielectric fluids in accordance with an embodiment have excellent compatibility with many metals including copper, aluminum, brass, bronze, with set galvanic action from combinations of metals and thus no ionic stripping or transport or galvanic action occurs. In various embodiments self-optimizing system performance for VDF cooling technology may be as follows. In general with reference back to FIG. 10A, sub-cooled fluid enters and flows through pump 1030 in a 100% liquid phase. Liquid flows though conduit 1045 connecting pump 1040 to cold plates within each of power cubes 1010. Sensible heat transfer occurs in the cold plates, causing fluid flow to boil to a predetermined liquid/vapor percentage. Next multiple phases flow from conduits 1015 from the cold plates to heat exchanger 1020, which dissipates heat to the cooling fluid medium (air, water, etc.) and condenses to liquid. A mixture of fluid and vapor enters the condenser where heat is released and the mixture condenses to liquid. Sub-cooling occurs via sensible heat transfer, reducing temperature of liquid to ensure 100% liquid enters accumulator 1030 (along with the flow of liquid coolant from external heat exchanger 1080) and thereafter to pump 1040, and the cycle repeats.

In an embodiment, for steady-state operation the system design is sized for a maximum of 80% liquid/vapor quality at the outlet of each power cube. As load increases, the system moves further into the vapor dome, but design parameters may be set to size it so cold plates never dry out. As the load decreases, the system boils less. There are no penalties in this in terms of cold plate temperatures because fluid flows are low and pump parasitic power draw is low, as the system reacts quickly to varying power levels and fluid flow is constant. Using a two-phase cooling system, a higher horsepower rating can be achieved, realizing more power density while reducing unit cost of cooling. Other cost benefits may include: more electronics reliability due to less thermal switching; less maintenance as the external air does not enter the electronics section (e.g., when using a NEMA-4 enclosure); less heat load on a HVAC system when a drive system is installed inside a building; the drive can go from zero to full rating without having any thermal issues (i.e., very small time constant for cooling); and can have an option of air and water cooled with the same system.

As with the drive system itself, the cooling system components within the power cubes are also modular and can be replaced quickly in case of failures. Also, the cooling system is modular with each slice. If a customer needs to add more rating in the drive, there is no need to custom design the cooling system for the whole drive system. And as such the slice cooling system can allow mass production of the cooling system independently of the rating of the drive. Cooling systems described herein may be used for regenerative as well as non-regenerative medium voltage drive systems.

Figure 13:
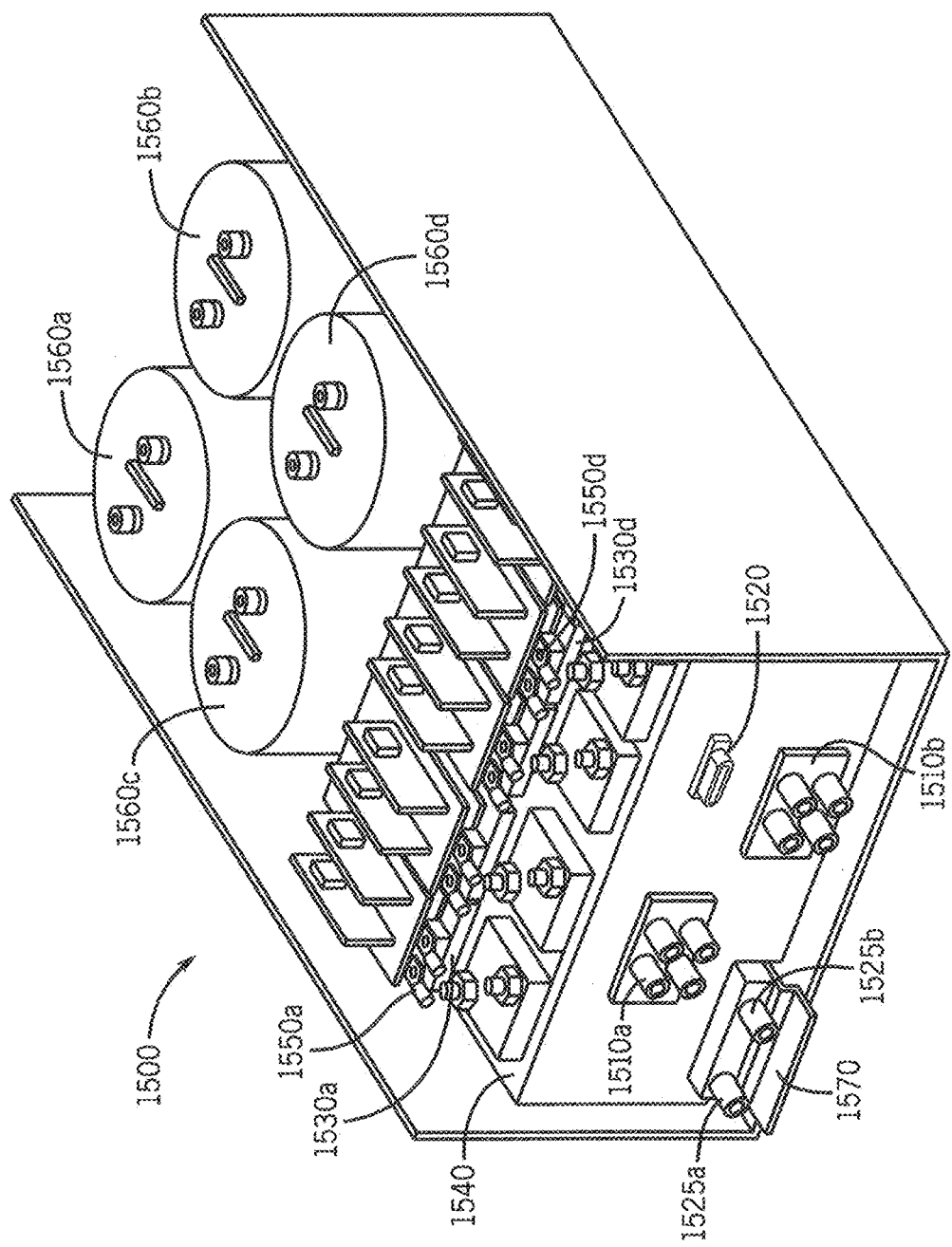
FIG. 13 is an isometric view of a power cube in accordance with another embodiment of the present invention.

Referring now to FIG. 13, shown is an isometric view of a power cube in accordance with another embodiment of the present invention. As shown in FIG. 13, power cube 1500 may be configured differently from the divided fixed and pluggable-based power cubes, e.g., of FIGS. 2A-2D. Instead here, a unitary moveable power cube design exists. As seen, the power cube is configured to be blind mate inserted into a backplane or manifold assembly of a cabinet. In the illustration shown, this blind mating may be realized by way of power connections $1510_a$ and $1510_b$. In addition, to provide communication of data and control signals to and from controllers within the power cube and a master controller, a blind mate electrical connection 1520 may also be provided. In addition, to enable cooling via a cooling system in accordance with an embodiment of the present invention, blind mate quick connect ports $1525_a$ and $1525_b$ may be provided that can connect with corresponding connection members within a manifold assembly to enable the flow of liquid coolant and return two phase vapor and liquid via inlet and outlet conduits, respectively as described above.

For purposes of discussion of the cooling operation of the power cube, note that the inlet conduit via inlet port $1525_a$ (for example) may communicate a flow of liquid coolant to a first of a plurality of independent cold plates $1530_a$-$1530_d$. In general, each of these cold plates may include a channel, where the cold plates are connected together in series to thus enable a series of flow of liquid coolant through the multiple cold plates, and thereafter to enable a flow of heated two phase vapor and liquid coolant to an output conduit (not shown) via outlet port $1525_b$. By way of VDF-based cooling, the cold plates of a given power cube may be substantially isothermal, in contrast to a water-based cooling system, in which serial communication of liquid coolant may cause different temperature of the cold plates.

In the embodiment shown, cold plates $1530_a$-$1530_d$ may be configured on a base plate 1540 which in an embodiment may be an aluminum plate to provide heat spreading capability. As further shown, a plurality of resistors may be configured on this plate. Above cold plates $1530_a$-$1530_d$ may be a corresponding plurality of IGBTs which in the illustration shown are shown as IGBTs $1550_a$-$1550_d$. Understand that each such IGBT may be associated with a switching controller such as a control board adapted above the corresponding IGBT (these control boards are not shown for ease of illustration in FIG. 13).

Sufficient cooling of the power cube may be realized by way of aluminum plate 1540 that acts as a heat spreader along with the cold plates $1530_a$-$1530_d$. Other components, such as a plurality of capacitors $1560_a$-$1560_d$ may not have independent cooling mechanisms, since they may not produce great amounts of heat during operation. In other embodiments, to provide additional cooling capabilities, one or more fans or other cooling mechanisms may be included in the power cubes.

As further shown in FIG. 13, a support bracket 1570 may be configured below ports $1525_a$ and $1525_b$, to prevent damage to these ports during insertion/removal operations. Although shown at this location, understand that multiple other support brackets may be present in other implementations. Although shown at this high level in the simplified view in FIG. 13, understand that additional components may be present within the power cubes, such as diodes (in a non-regeneration-capable power cube), pre-charging resistors, capacitors and other such components.

FIG. 14 shows an illustration of coupling of a power cube to a manifold assembly via a dielectric section in accordance with an embodiment of the present invention. As shown in FIG. 14, power cube 1500 is shown being inserted into a manifold assembly 1600. In the high level shown, note the presence of port 1525 and bracket 1570. As further shown, power connections $1510_a$ and $1510_b$ are illustrated. All of these connections can be blind mated into corresponding connection members of manifold assembly 1600. However for ease of illustration only a connection member 1610 to receive port 1525 is shown. Of course similar connection members can be present to enable blind mating of the power connections and electrical connections. In various embodiments, an interface section 1620 of manifold assembly 1600 may be implemented using dielectric components to provide flexibility and insulation. As an example, various members of this dielectric section may be formed of TEFLON or TORLON or another flexible dielectric material such as thermoplastic hoses. Although shown at this high level view in the embodiment of FIG. 14, understand the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A drive system comprising:
   an enclosed cabinet including a plurality of slices of the drive system, the enclosed cabinet including: a power cube bay including:
      a first portion having a plurality of cube chambers each having a protective enclosure in which to house a corresponding one of a plurality of power cubes, each of the plurality of power cubes including an inlet port to receive a flow of liquid coolant and an outlet port to output a flow of two phase coolant; and
      a second portion to accommodate at least a portion of a cooling system for the drive system, the cooling system comprising a two phase system and including an inlet conduit coupled to a plurality of first connection members each to connect to a corresponding inlet port of one of the plurality of power cubes to enable the flow of liquid coolant to the corresponding power cube, an outlet conduit coupled to a plurality of second connection members each to connect to a corresponding outlet port of one of the plurality of power cubes to enable the flow of two phase coolant from the corresponding power cube; and
   a transformer bay to house at least one transformer to couple between a utility connection and the plurality of power cubes, the at least one transformer to output a plurality of phases of output power, the transformer bay to further house a heat exchanger to enable heat exchange with the flow of liquid coolant,
   wherein the transformer comprises at least two windings, a first flow of air to pass through a first winding of the at least two windings in a first direction, a second flow of the air to pass through a second winding of the at least two windings, the second flow of the air being opposite to the first flow of the air.

2. The drive system of claim 1, further comprising a plurality of fans adapted about the transformer, wherein a first fan is adapted to a first side of the transformer adjacent to the first winding of the transformer to provide the first flow of the air.

3. The drive system of claim 2, further comprising second and third fans adjacent to the heat exchanger.

4. The drive system of claim 3, wherein the at least two windings further comprise a third winding, a third flow of the air to pass through the third winding, the third flow of the air being opposite to the first flow of the air, wherein the first fan causes the first flow of the air towards the second and third windings of the transformer and the second and third fans cause the second and third flows of the air towards the first winding of the transformer.

5. The drive system of claim 1, wherein the plurality of power cubes each has at least one cold plate configured to receive the flow of liquid coolant and to output the flow of two phase coolant.

6. The drive system of claim 5, wherein the at least one cold plate comprises a plurality of cold plates each including a channel adapted to communicate the liquid coolant along a path to enable heat exchange with a switching device coupled to the corresponding cold plate.

7. The drive system of claim 1, wherein the enclosed cabinet is located in a building enclosure and further comprising a second heat exchanger located externally to the building enclosure, the second heat exchanger coupled to provide the flow of liquid coolant to the inlet conduit and to receive the flow of two phase coolant from the outlet conduit.

8. The drive system of claim 1, wherein the plurality of first connection members and the plurality of second connection members comprise blind mating connections to mate with a corresponding inlet port and outlet port, respectively, of one of the plurality of power cubes, the second portion of the power cube bay comprising a manifold assembly to support the inlet conduit and the outlet conduit and further to support the plurality of first connection members and the plurality of second connection members, and to enable blind mating of power, electrical, and cooling connections of the plurality of power cubes.

9. The drive system of claim 8, further comprising a dielectric portion to couple one of the plurality of power cubes to the manifold assembly, wherein the dielectric portion provides electrical isolation between the power cube and the manifold assembly.

10. The drive system of claim 1, wherein the enclosed cabinet comprises a NEMA-4 enclosure.

11. A drive system comprising:
    a transformer having a primary winding to receive power from a utility connection and a plurality of secondary windings, the transformer enclosed in an enclosed enclosure including a first heat exchanger to cool a fluid medium;
    a plurality of power cubes each coupled to a corresponding one of the plurality of secondary windings and including a rectifier, a DC-link, and an inverter, wherein each power cube of the power cubes includes a plurality of cold plates each coupled to a corresponding switching device of the inverter, an inlet port in communication with a first one of the plurality of cold plates and an outlet port in communication with a last one of the plurality of cold plates; and
    a manifold assembly to support supplying the fluid medium to the cold plates and the enclosed enclosure, an inlet conduit and an outlet conduit and further to support a plurality of first connection members to enable mating of each of the plurality of first connection members to the inlet port of a respective one of the plurality of power cubes and the enclosed enclosure and to enable mating of each of the plurality of second connection members to the outlet port of the respective one of the plurality of power cubes and the enclosed enclosure to enable two phase cooling of the plurality of power cubes and the transformer.

12. The drive system of claim 11, further comprising a cabinet including a transformer bay to support the transformer and a power cube bay to support the plurality of power cubes, wherein the cabinet is a NEMA-4 enclosure.

13. The drive system of claim 11, further comprising a plurality of fans adapted about the transformer.

14. The drive system of claim 13, wherein a first portion of the plurality of fans is adjacent the transformer and a second portion of the plurality of fans is adjacent the first heat exchanger.

15. A drive system comprising:
    a plurality of slices configured within an enclosed cabinet, each of the plurality of slices including:
       a transformer having a primary winding to receive power from a utility connection and at least one secondary winding;
       a first heat exchanger adjacent to the transformer to enable heat exchange with the transformer, wherein the first heat exchanger is coupled to an inlet conduit to receive a flow of liquid coolant and coupled to an outlet conduit to output a flow of two phase coolant;

a plurality of power cubes each coupled to the at least one secondary winding and including a rectifier, a DC-link, and an inverter, wherein each power cube of the power cubes includes a plurality of cold plates each coupled to a corresponding switching device of the inverter, an inlet port in communication with a first one of the plurality of cold plates and an outlet port in communication with a last one of the plurality of cold plates; and a manifold assembly to support the inlet conduit and the outlet conduit and further to support a plurality of first connection members and a plurality of second connection members to enable mating of each of the plurality of first connection members to the inlet port of the first one of the plurality of power cubes and each of the plurality of second connection members to the outlet port of the last one of the plurality of power cubes to enable two phase cooling of the plurality of power cubes; and a second heat exchanger to receive the flow of two phase coolant from the outlet conduit and to enable heat exchange and to provide the liquid coolant to the inlet conduit, the second heat exchanger external to the enclosed cabinet.

16. The drive system of claim 15, wherein the second heat exchanger is external to an enclosure housing the enclosed cabinet.

17. The drive system of claim 16, further comprising a third heat exchanger associated with the plurality of power cubes to enable heat exchange with the power cubes.

* * * * *